US011799285B2

(12) United States Patent
Yang et al.

(10) Patent No.: US 11,799,285 B2
(45) Date of Patent: Oct. 24, 2023

(54) METHOD FOR STARTING PHOTOVOLTAIC RAPID SHUTDOWN SYSTEM, APPLICATION APPARATUS AND SYSTEM

(71) Applicant: Sungrow Power Supply Co., Ltd., Hefei (CN)

(72) Inventors: Yu Yang, Anhui (CN); Yanfei Yu, Anhui (CN); Jun Xu, Anhui (CN); Qiaodi Chen, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 0 days.

(21) Appl. No.: 17/219,406

(22) Filed: Mar. 31, 2021

(65) Prior Publication Data

US 2021/0391710 A1 Dec. 16, 2021

(30) Foreign Application Priority Data

Jun. 15, 2020 (CN) .......................... 202010542025.X

(51) Int. Cl.
*H02S 50/00* (2014.01)
*H02H 3/06* (2006.01)
(Continued)

(52) U.S. Cl.
CPC ............... *H02H 7/20* (2013.01); *H02J 3/381* (2013.01); *H02J 2300/24* (2020.01)

(58) Field of Classification Search
CPC .......... H02H 7/20; H02H 3/202; H02H 3/063; H02J 3/381; H02J 2300/24; H02S 40/30;
(Continued)

(56) References Cited

U.S. PATENT DOCUMENTS

| 2014/0137920 A1* | 5/2014 | Berg | ....................... H02S 50/00 136/244 |
| 2016/0006392 A1* | 1/2016 | Höft | ...................... H02H 11/00 361/78 |

(Continued)

FOREIGN PATENT DOCUMENTS

| CN | 109617523 | * | 4/2019 |
| CN | 109617523 | A | 4/2019 |

(Continued)

OTHER PUBLICATIONS

Extended European Search Report for European Application No. 21167117.7, dated Sep. 29, 2021.
(Continued)

*Primary Examiner* — Elim Ortiz
(74) *Attorney, Agent, or Firm* — Wolf, Greenfield & Sacks, P.C.

(57) ABSTRACT

A method for starting a photovoltaic rapid shutdown system, an application apparatus and a system are provided. In this method, the inverter system controls a voltage of a direct current bus in the photovoltaic rapid shutdown system. The photovoltaic module breaker makes determination based on a detected output voltage of the photovoltaic module breaker. In a case that the change characteristics of the voltage of the direct current bus connected to the photovoltaic module breaker meets the predetermined turn-on condition, the photovoltaic module breaker controls itself to be turned on. Therefore, the photovoltaic module breaker can determine whether the photovoltaic module breaker receives a turn-on signal only based on its own voltage acquisition device without an additional receiving apparatus.

9 Claims, 16 Drawing Sheets

(51) Int. Cl.
*H02H 7/20* (2006.01)
*H02J 3/38* (2006.01)

(58) Field of Classification Search
CPC .... H02S 50/00; H01L 31/02021; H02M 1/36; Y02E 10/56
USPC .......................................................... 307/78
See application file for complete search history.

(56) References Cited

U.S. PATENT DOCUMENTS

| | | | |
|---|---|---|---|
| 2018/0248359 A1* | 8/2018 | Zou | .................. H01L 31/02021 |
| 2020/0195168 A1 | 6/2020 | Gloes et al. | |
| 2020/0343730 A1 | 10/2020 | Zhu et al. | |

FOREIGN PATENT DOCUMENTS

| | | | |
|---|---|---|---|
| CN | 109787269 | * | 5/2019 |
| CN | WO2019127022 | * | 7/2019 |
| CN | 110677120 A | | 1/2020 |
| EP | 3 664 268 A1 | | 6/2020 |
| WO | WO 2019/127022 A1 | | 7/2019 |

OTHER PUBLICATIONS

Notice of Reasons for Refusal for Japanese Application No. 2021-067499, dated Nov. 15, 2022.
Examination Report for European Application No. 21167117.7, dated Aug. 12, 2022.

* cited by examiner

METHOD FOR STARTING PHOTOVOLTAIC RAPID SHUTDOWN SYSTEM, APPLICATION APPARATUS AND SYSTEM

The present application claims priority to Chinese Patent Application No. 202010542025.X, titled "METHOD FOR STARTING PHOTOVOLTAIC RAPID SHUTDOWN SYSTEM, APPLICATION APPARATUS AND SYSTEM", filed on Jun. 15, 2020 with the Chinese Patent Office, which is incorporated herein by reference in its entirety.

FIELD

The present disclosure relates to the field of photovoltaic grid-connected power generation technology, and in particular to a method for starting a photovoltaic rapid shutdown system, an application apparatus and a system.

BACKGROUND

As a renewable energy power generation technology, photovoltaic power generation technology is widely used. A photovoltaic array in a photovoltaic system outputs direct current, which is converted into alternating current by an inverter and then transmitted to a grid. However, a voltage across the photovoltaic array which is formed by series-connected photovoltaic modules is very high. In order to improve safety of the photovoltaic system, the photovoltaic array is required to be turned off quickly in the event of a safety fault. After the safety fault is solved, the photovoltaic array is required to resume power generation. That is, each photovoltaic module breaker in the photovoltaic system is turned on again, so that a photovoltaic module connected to the photovoltaic module breaker can output electric energy.

In the conventional technology, in order to turn on the photovoltaic module breaker, it is required to continuously send heartbeat communication signals by a central controller, or send a periodic excitation pulse source by a shutdown control module on a direct current bus. In these two solutions, it is required to additionally arrange a receiving module in the photovoltaic module breaker, which increases hardware cost of the photovoltaic module breaker.

SUMMARY

In view of this, a method for starting a photovoltaic rapid shutdown system, an application apparatus and a system are provided according to the present disclosure, to reduce the hardware cost of the photovoltaic module breaker in the photovoltaic rapid shutdown system while starting the photovoltaic rapid shutdown system, thereby reducing hardware cost of the photovoltaic rapid shutdown system.

A method for starting a photovoltaic rapid shutdown system is provided according to a first aspect of the present disclosure. The method for starting a photovoltaic rapid shutdown system includes: controlling, by an inverter system in the photovoltaic rapid shutdown system, a voltage of a direct current bus in the photovoltaic rapid shutdown system; and determining, by a photovoltaic module breaker in the photovoltaic rapid shutdown system based on a detected output voltage of the photovoltaic module breaker, whether change characteristics of the voltage of the direct current bus connected to the photovoltaic module breaker meets a predetermined turn-on condition; and turning on the photovoltaic module breaker by itself in a case that the change characteristics of the voltage of the direct current bus connected to the photovoltaic module breaker meets the predetermined turn-on condition.

In an embodiment, the predetermined turn-on condition indicates that a small pulse is formed in the voltage of the direct current bus.

In an embodiment, the small pulse is formed in the voltage of the direct current bus by operating the direct current bus into a short-circuit state and operating the direct current bus into a non-short-circuit state.

In an embodiment, the small pulse is formed in the voltage of the direct current bus by alternately operating the direct current bus into the short-circuit state and the non-short-circuit state.

In an embodiment, after the determining, by a photovoltaic module breaker in the photovoltaic rapid shutdown system based on a detected output voltage of the photovoltaic module breaker, whether change characteristics of the voltage of the direct current bus connected to the photovoltaic module breaker meets a predetermined turn-on condition, the method for starting a photovoltaic rapid shutdown system further includes: maintaining the photovoltaic module breaker in an off state in a case that the change characteristics of the voltage of the direct current bus connected to the photovoltaic module breaker does not meet the predetermined turn-on condition.

In an embodiment, before the controlling, by an inverter system in the photovoltaic rapid shutdown system, a voltage of a direct current bus in the photovoltaic rapid shutdown system, the method for starting a photovoltaic rapid shutdown system further includes: determining, by the photovoltaic module breaker, whether a detected state parameter of the photovoltaic module breaker meets a predetermined normal condition, where the photovoltaic module breaker outputs a preset starting voltage to the direct current bus connected to the photovoltaic module breaker in a case that the state parameter meets the predetermined condition; and detecting the voltage of the direct current bus by the inverter system and determining, by the inverter system, whether the voltage of the direct current bus meets a starting condition, where the controlling, by an inverter system in the photovoltaic rapid shutdown system, a voltage of a direct current bus in the photovoltaic rapid shutdown system is performed in a case that the voltage of the direct current bus meets the starting condition.

In an embodiment, the state parameter includes at least one of an input current, an input voltage, and a temperature.

In an embodiment, the detecting the voltage of the direct current bus by the inverter system and determining, by the inverter system, whether the voltage of the direct current bus meets a starting condition includes: detecting the voltage of the direct current bus by the inverter system; determining, by the inverter system based on the voltage of the direct current bus, the number of the photovoltaic module breaker that outputs the preset starting voltage to the direct current bus; and determining, by the inverter system, whether the number of the photovoltaic module breaker that outputs the preset starting voltage is greater than or equal to a preset number. It is determined that the voltage of the direct current bus meets the starting condition in a case that the number of the photovoltaic module breaker that outputs the preset starting voltage is greater than or equal to the preset number; and it is determined that the voltage of the direct current bus does not meet the starting condition in a case that the number of the photovoltaic module breaker that outputs the preset starting voltage is not greater than or equal to the preset number.

In an embodiment, the controlling, by an inverter system in the photovoltaic rapid shutdown system, a voltage of a direct current bus in the photovoltaic rapid shutdown system includes: controlling, by the inverter system according to a predetermined rule, the voltage of the direct current bus, to change the voltage of the direct current bus according to a predetermined change rule.

In an embodiment, the controlling, by the inverter system according to a predetermined rule, the voltage of the direct current bus includes: alternately operating the direct current bus in the short-circuit state during a first time period and operating the direct current bus in the non-short-circuit state during a second time period.

In an embodiment, the preset predetermined change rule indicates that the voltage of the direct current bus has a value of 0 during the first time period, and the voltage of the direct current bus has a corresponding value during the second time period.

In an embodiment, before the controlling, by an inverter system in the photovoltaic rapid shutdown system, a voltage of a direct current bus in the photovoltaic rapid shutdown system, the method for starting a photovoltaic rapid shutdown system further includes: detecting, by the inverter system, a voltage of each of direct current buses in the photovoltaic rapid shutdown system; and determining, by the inverter system, whether the voltage of each of the direct current buses meets a predetermined abnormal condition. In a case that the voltage of at least one of the direct current buses meets the predetermined abnormal condition, the inverter system generates an alarm; and the inverter system controls the voltage of the direct current bus according to a predetermined abnormal rule, or the inverter system directly operates without changing the voltage of the direct current bus; or the inverter system stops operating. In a case that the voltage of none of the direct current buses meets the predetermined abnormal condition, the controlling, by an inverter system in the photovoltaic rapid shutdown system, a voltage of a direct current bus in the photovoltaic rapid shutdown system is performed.

In an embodiment, the inverter system controlling the voltage of the direct current bus according to the predetermined abnormal rule includes: in a case that a voltage of a direct current bus that meets the predetermined abnormal condition is less than a first preset voltage, limiting a pulse width to be within a preset range and operating the direct current bus in the short-circuit state in the first time period, and operating the direct current bus out of the short-circuit state in the second time period.

In an embodiment, the inverter system directly operating without changing the voltage of the direct current bus includes: in a case that the voltage of the direct current bus that meets the predetermined abnormal condition is greater than a second preset voltage, not short-circuiting the direct current bus to maintain a photovoltaic module breaker connected to the direct current bus in an off state, and wherein the second preset voltage is greater than or equal to the first preset voltage.

A photovoltaic module breaker is further provided according to a second aspect of the present disclosure. The photovoltaic module breaker includes a switch unit, a starting voltage module, a driving circuit, a processor, a bypass diode, and a parameter acquisition module. The switch unit is arranged on a positive branch or a negative branch of the photovoltaic module breaker, and is configured to turn on or turn off the photovoltaic module breaker under control of the processor. The parameter acquisition module is configured to acquire a state parameter and an output voltage of photovoltaic module breaker and output the acquired state parameter and output voltage to the processor. The starting voltage module is configured to output, in a case that the photovoltaic module breaker is turned off and the state parameter meets a preset normal condition, a starting voltage to an output end of the photovoltaic module breaker under control of the processor. The bypass diode is configured to realize a bypass function of the photovoltaic module breaker in the case that the photovoltaic module breaker is turned off. An output end of the processor is connected to a control end of the switch unit via the driving circuit. Under control of the processor with the starting voltage module, the parameter acquisition module, the driving circuit, and the switch unit, the photovoltaic module breaker is configured to: determine whether change characteristics of a voltage of a direct current bus connected to the photovoltaic module breaker meet a predetermined turn-on condition based on a detected output voltage of the photovoltaic module breaker; and be turned on by itself in a case that the change characteristics of the voltage of the direct current bus connected to the photovoltaic module breaker meet the predetermined turn-on condition.

In an embodiment, the photovoltaic module breaker is further configured to: determine whether a detected state parameter of the photovoltaic module breaker meets a predetermined normal condition; and output a preset starting voltage to the direct current bus connected to the photovoltaic module breaker in the photovoltaic module shutdown system in a case that the state parameter meets the predetermined normal condition.

In an embodiment, the starting voltage module includes a low-voltage power supply, a first capacitor, and an anti-backflow diode. The low-voltage power supply is configured to output, under control of the processor, the starting voltage via the anti-backflow diode in a case that the photovoltaic module breaker is turned off and the state parameter meets the predetermined normal condition. A cathode of the anti-backflow diode serves as a positive output end of the starting voltage module, an anode of the anti-backflow diode is connected to an output end of the low-voltage power supply and one end of the first capacitor, and the other end of the first capacitor serves as a negative output end of the starting voltage module. Alternatively, a cathode of the anti-backflow diode is connected to one end of the first capacitor with a connection point serving as a positive output end of the starting voltage module, an anode of the anti-backflow diode is connected to an output end of the low-voltage power supply, and the other end of the first capacitor serves as a negative output end of the starting voltage module. The low-voltage power supply has internal resistance and may be short-circuited.

In an embodiment, the parameter acquisition module includes an input voltage acquisition unit and an output voltage acquisition unit. The input voltage acquisition unit is configured to acquire an input voltage of the photovoltaic module breaker. The output voltage acquisition unit is configured to acquire the output voltage of the photovoltaic module breaker.

In an embodiment, the parameter acquisition module further includes a current acquisition unit. The current acquisition unit is arranged on the negative branch of the photovoltaic module breaker and between an anode of the bypass diode and a negative output end of the photovoltaic module breaker. Alternatively, the current acquisition unit is arranged on the negative branch of the photovoltaic module breaker and between an anode of the bypass diode and a negative output end of the starting voltage module. Alternatively, the current acquisition unit is arranged on the positive branch of the photovoltaic module breaker and between a cathode of the bypass diode and a positive output end of the photovoltaic module breaker. Alternatively, the current acquisition unit is arranged on the positive branch of the photovoltaic module breaker and between a cathode of the bypass diode and a positive output end of the starting voltage module.

In an embodiment, the switch unit includes at least one switch module. In a case that the number of the at least one switch module is equal to one, an input end of the switch module serves as an input end of the switch unit, an output end of the switch module serves as an output end of the switch unit, and a control end of the switch module serves as a control end of the switch unit. In a case that the number of the at least one switch module is more than one, an input end of a branch formed by connecting the more than one switch module in series serves as an input end of the switch unit, an output end of the branch serves as an output end of the switch unit, and control ends of the switch modules serve as a control end of the switch unit.

An inverter system is further provided according to a third aspect of the present disclosure. The inverter system includes a direct current voltage control circuit and an inverter. The direct current voltage control circuit is configured to control a voltage of a direct current bus in a photovoltaic rapid shutdown system. The inverter system is configured to control, by using the inverter and the direct current voltage control circuit, the voltage of the direct current bus in the photovoltaic rapid shutdown system.

In an embodiment, before controlling the voltage of the direct current bus, the inverter system is further configured to: detect the voltage of the direct current bus in the photovoltaic rapid shutdown system and determine whether the voltage of the direct current bus in the photovoltaic rapid shutdown system meets a starting condition, where the controlling the voltage of the direct current bus is performed in a case that the voltage of the direct current bus meets the starting condition.

In an embodiment, before controlling the voltage of the direct current bus, the inverter system is further configured to: detect a voltage of each of direct current buses in the photovoltaic rapid shutdown system; and determine whether the voltage of each of the direct current buses meets a predetermined abnormal condition. In a case that the voltage of at least one of the direct current buses meets the predetermined abnormal condition, the inverter system generates an alarm; and the inverter system controls the voltage of the direct current bus according to a predetermined abnormal rule, or the inverter system directly operates without changing the voltage of the direct current bus; or the inverter system stops operating. In a case that the voltage of none of the direct current buses meets the predetermined abnormal condition, the controlling, by an inverter system in the photovoltaic rapid shutdown system, a voltage of a direct current bus in the photovoltaic rapid shutdown system is performed In an embodiment, the direct current voltage control circuit is implemented by a direct current voltage controller independently arranged on the direct current bus. The inverter includes an inverter circuit. A direct current side of the inverter circuit serves as a direct current side of the inverter, and an alternating current side of the inverter circuit serves as an alternating current side of the inverter.

In an embodiment, the direct current voltage control circuit may be implemented by a direct current/direct current (DC/DC) circuit arranged in the inverter. The inverter includes an inverter circuit. One end of the DC/DC circuit serves as a direct current side of the inverter. The other end of the DC/DC circuit is connected to a direct current side of the inverter circuit. An alternating current side of the inverter circuit serves as an alternating current side of the inverter.

In an embodiment, the DC/DC circuit is a basic boost circuit or a three-level boost circuit.

A photovoltaic rapid shutdown system is further provided according to a fourth aspect of the present disclosure. The photovoltaic rapid shutdown system includes at least one shutdown system and at least one inverter system according to any one of the third aspect of the present disclosure. The shutdown system includes a direct current bus, at least N photovoltaic modules and at least N photovoltaic module breakers according to any of the second aspect of the present disclosure, where N is positive integer. In the shutdown system, output ends of the photovoltaic module breakers are cascaded. Input ends of the photovoltaic module breakers are connected to output ends of respective photovoltaic modules. A positive electrode of a circuit formed by cascading the photovoltaic module breakers is connected to a positive electrode of a direct current interface of the inverter system via a positive electrode of the direct current bus. A negative electrode of the circuit formed by cascading the photovoltaic module breakers is connected to a negative electrode of the direct current interface of the inverter system via a negative electrode of the direct current bus.

It can be seen from the above technical solutions that, in the method for starting a photovoltaic rapid shutdown system according to the present disclosure, first, the inverter system controls a voltage of a direct current bus in the photovoltaic rapid shutdown system. Then, the photovoltaic module breaker determines, based on a detected output voltage of the photovoltaic module breaker, whether change characteristics of the voltage of the direct current bus connected to the photovoltaic module breaker meets a predetermined turn-on condition. In a case that the change characteristics of the voltage of the direct current bus connected to the photovoltaic module breaker meets the predetermined turn-on condition, the photovoltaic module breaker is turned on by itself. Therefore, the photovoltaic module breaker can determine whether the photovoltaic module breaker receives a turn-on signal only based on its own voltage acquisition device without additionally arranging any receiving apparatus, thereby reducing the hardware cost of the photovoltaic module breaker while the photovoltaic module breaker can communicate with an external apparatus.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. It is apparent that the drawings in the following description show only some embodiments of the present disclosure, and other drawings may be obtained by those skilled in the art from the drawings without any creative work.

DETAILED DESCRIPTION OF EMBODIMENTS

The technical solutions in embodiments of the present disclosure are described clearly and completely in conjunction with the drawings in the embodiments of the present disclosure hereinafter, so that purposes, technical solutions and advantages of the embodiments of the present disclosure are clearer. It is apparent that the described embodiments are only some rather than all embodiments of the present disclosure. All other embodiments obtained by those skilled in the art based on the embodiments of the present disclosure without any creative work fall within the protection scope of the present disclosure.

In this specification, terms "include", "comprise" or any other variants intended to be non-exclusive Therefore, a process, method, article or device including a series of elements includes not only these elements but also other elements that are not enumerated, or also include elements inherent in the process, method, article or device. Unless expressively limited otherwise, a statement "comprising (including) one . . . " does not exclude a case that other identical elements may exist in the process, method, article or device including these described elements.

A method for starting a photovoltaic rapid shutdown system is provided according to an embodiment of the present disclosure, to solve a problem of increased hardware cost of a photovoltaic module breaker in the conventional technology which is caused due to a receiving module additionally arranged in the photovoltaic module breaker.

Figure 13:
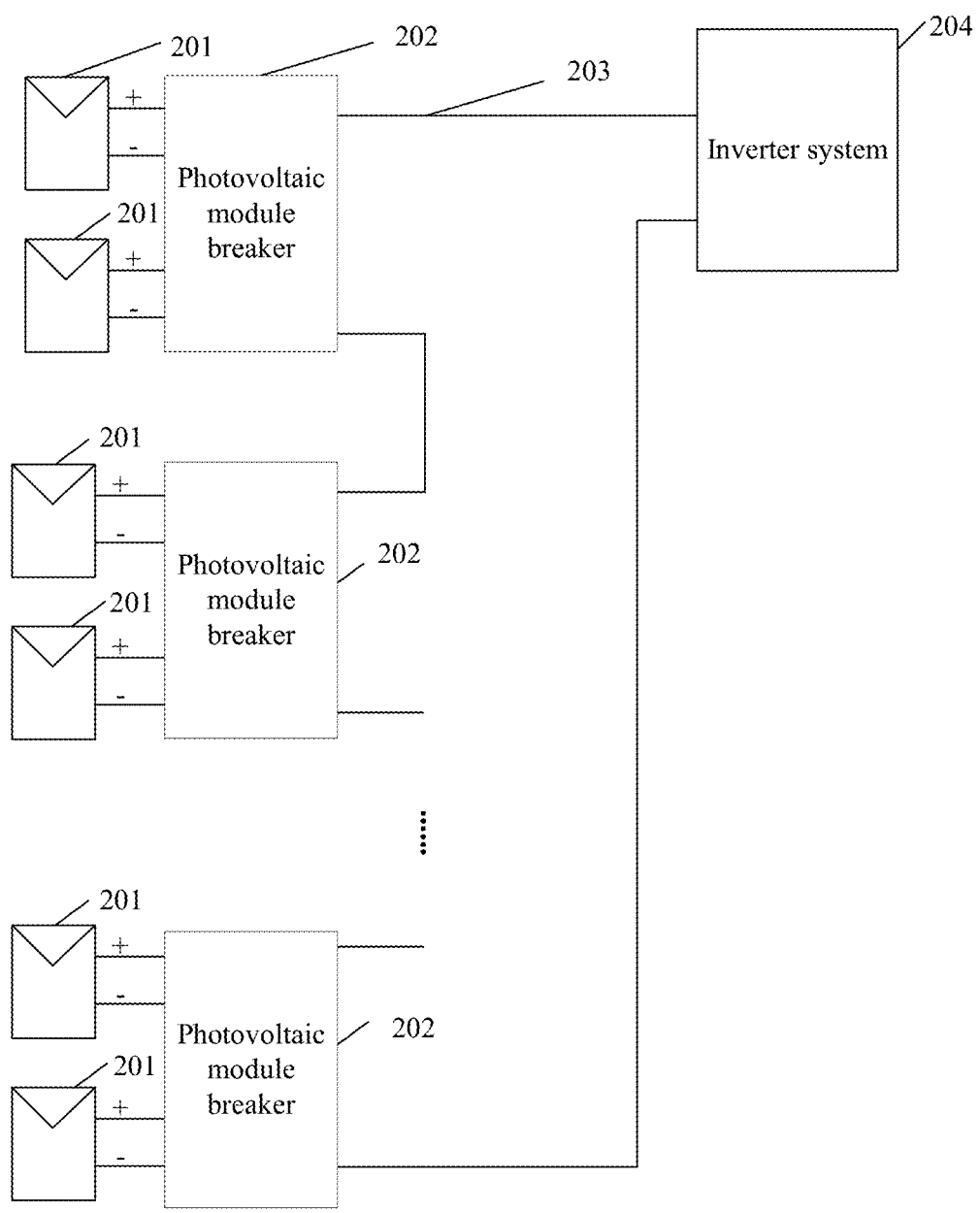
FIG. 13 is a schematic diagram showing a photovoltaic rapid shutdown system according to an embodiment of the present disclosure.

As shown in FIG. 13, the photovoltaic rapid shutdown system includes at least one shutdown system and at least one inverter system 204. The shutdown system includes a direct current bus 203, at least N photovoltaic modules 201 and at least N photovoltaic module breakers 202, where N is positive integer.

In the shutdown system, output ends of the photovoltaic module breakers 202 are cascaded. Input ends of the photovoltaic module breakers 202 are connected to output ends of respective photovoltaic modules 201. A positive electrode of a circuit formed by cascading the photovoltaic module breakers 202 is connected to a positive electrode of a direct current interface of the inverter system 204 via positive electrode of the direct current bus 203. A negative electrode of the circuit formed by cascading the photovoltaic module breakers 202 is connected to a negative electrode of the direct current interface of the inverter system 204 via a negative electrode of the direct current bus 203.

Figure 16:
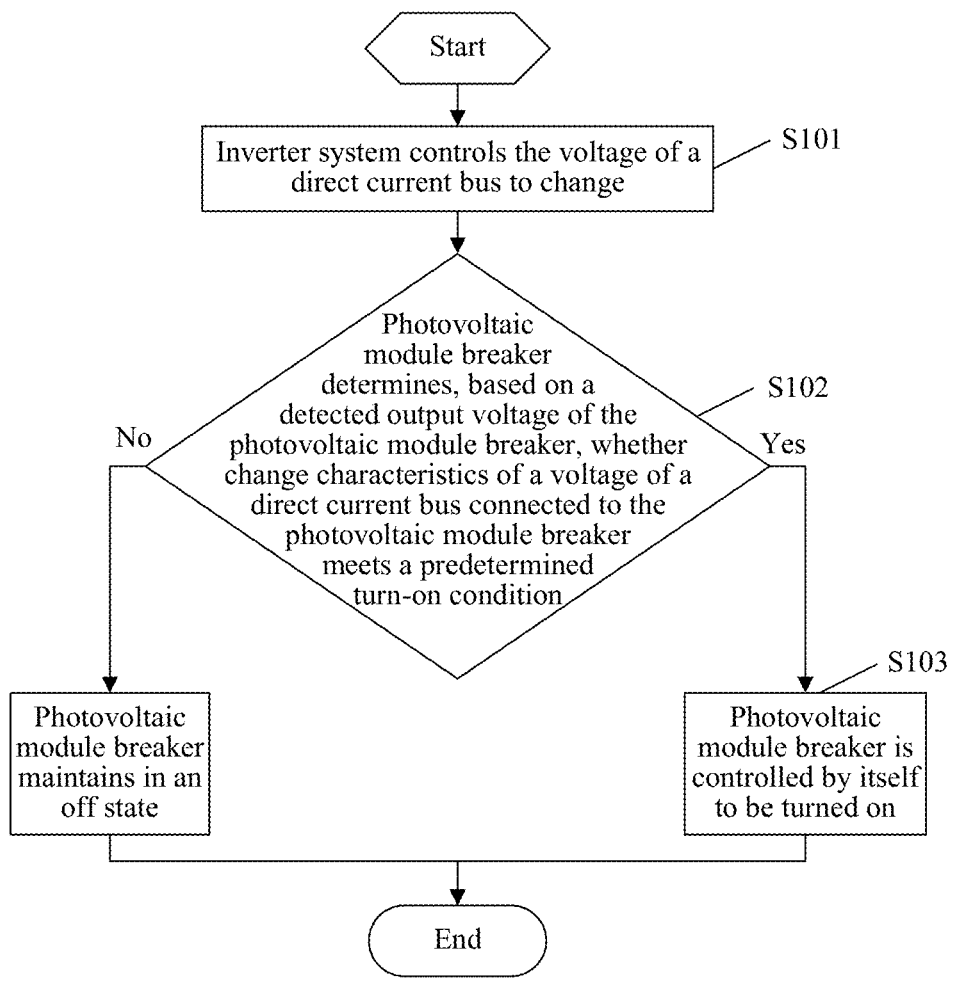
FIG. 16 is a schematic diagram showing a method for starting a photovoltaic rapid shutdown system according to another embodiment of the present disclosure.

As shown in FIG. 16, the method for starting a photovoltaic rapid shutdown system includes the following steps S101 to S103.

In step S101, an inverter system controls a voltage of a direct current bus.

It should be noted that the inverter system notifies a corresponding photovoltaic module breaker by controlling a voltage of a direct current bus, so that the photovoltaic module breaker is informed of being allowed to be turned on.

Figure 3:
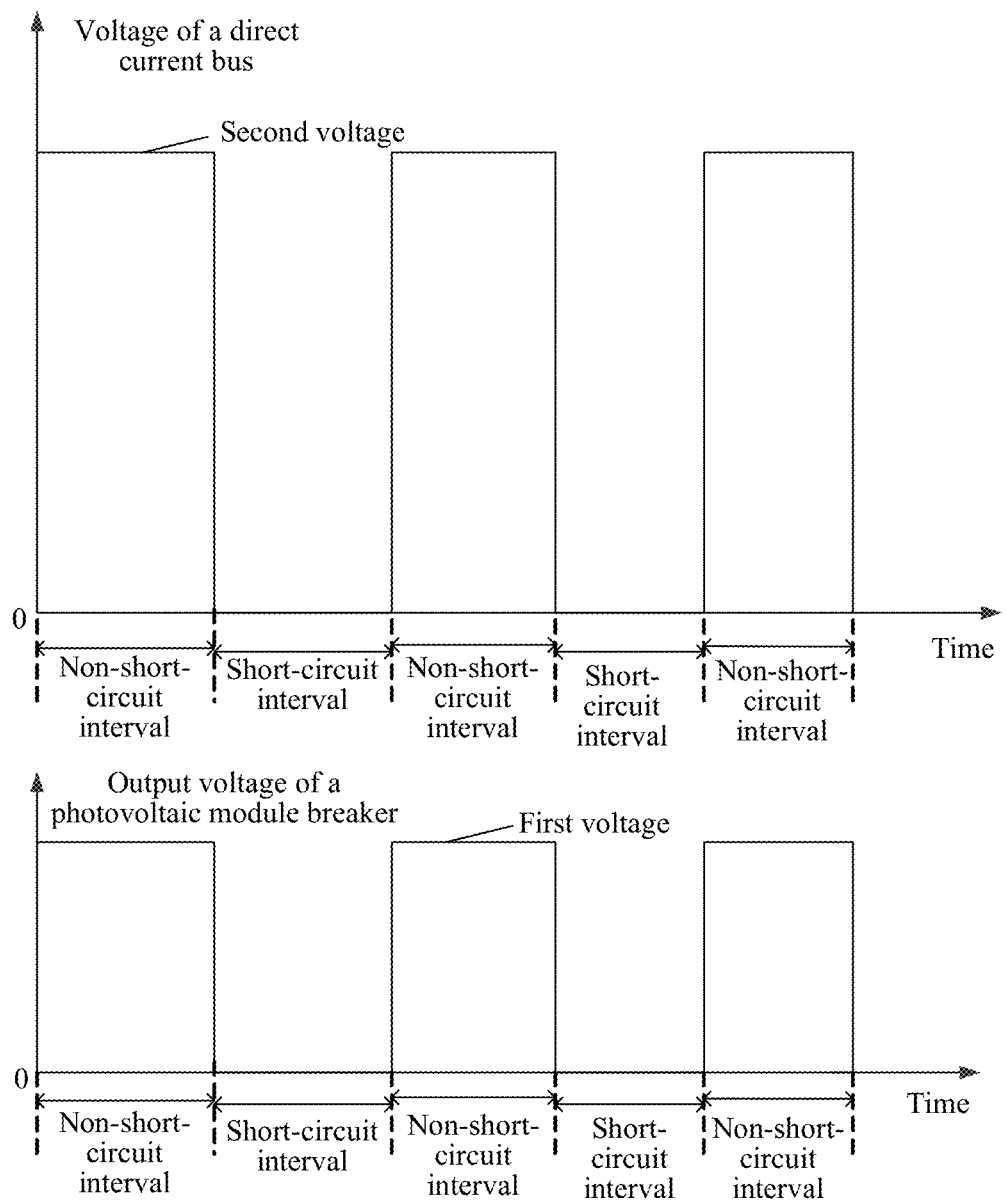
FIG. 3 is a schematic diagram showing a voltage of a direct current bus and an output voltage of a photovoltaic module breaker according to an embodiment of the present disclosure.

In practice, step S101 is performed as follows. The inverter system controls the voltage of the direct current bus according to a predetermined rule, so that the voltage of the direct current bus changes according to a predetermined change rule. For example, the following steps may be performed alternately, which includes: operating the direct current bus in a short-circuit state during a first time period; and operating the direct current bus out of the short-circuit state during a second time period. Accordingly, the voltage of the direct current bus is equal to zero during the first time period, and the voltage of the direct current bus has a set value, for example, a second voltage, during the second time period. As shown in FIG. 3, the second voltage is a voltage of the direct current bus during a second preset time period. A non-short-circuit interval is the second preset time period. A short-circuit interval is the first preset time period. It should be noted that the above steps may be performed for a preset number of times, and may also be performed throughout, which is not limited herein and any number of times is included in the protection scope of the present disclosure. It should further be noted that, the first preset time period may be equal to or not equal to the second preset time period in each operation of the above steps, which is not limited herein. The first preset time period and the second preset time period may be set according to actual conditions, all of which are included in the protection scope of the present disclosure. In different operations of the above steps, first preset time periods may be equal to or not equal to each other, which is not limited herein. These first preset time periods may be set according to actual conditions, all of which are included in the protection scope of the present disclosure. Second preset time periods may be equal to or not equal to each other, which is not limited herein. These second preset time periods may be set according to actual conditions, all of which are included in the protection scope of the present disclosure.

It should be noted that the inverter system and the photovoltaic module breaker jointly determines the first preset time period and the second preset time period, as well as the preset number of times.

In step S102, the photovoltaic module breaker determines, based on a detected output voltage of the photovoltaic module breaker itself, whether change characteristics of a voltage of a direct current bus connected to the photovoltaic module breaker meets a predetermined turn-on condition.

In a case that the change characteristics of the voltage of the direct current bus connected to the photovoltaic module breaker meets the predetermined turn-on condition, step S103 is performed. In a case that the change characteristics of the voltage of the direct current bus connected to the photovoltaic module breaker does not meet the predetermined turn-on condition, the photovoltaic module breaker maintains in an off state.

In step S103, the photovoltaic module breaker is turned on by itself.

The predetermined turn-on condition may indicate that a small pulse is formed in the voltage of the direct current bus. The small pulse is formed in the direct current bus by operating the direct current bus in a short-circuit state and operating the direct current bus in a non-short-circuit state. The direct current bus may be operated in the short-circuit state and the non-short-circuit state alternately. Accordingly, a change rule of the output voltage of the photovoltaic module breaker is as shown in FIG. 3. In the non-short-circuit interval, the voltage of the direct current bus is the second voltage, and the output voltage of the photovoltaic module breaker is a first voltage. In the short-circuit interval, the voltage of the direct current bus is zero, and the output voltage of the photovoltaic module switcher is zero. It should be noted that the direct current bus may be operated in the short-circuit state and the non-short-circuit state alternately for the preset number of times. For example, when it is detected that the direct current bus is operated in the short-circuit state and the non-short-circuit state alternately for the preset number of times, the photovoltaic module breaker is turned on by itself. The preset number of times may be two or more times, which is not described in detail herein and is within the protection scope of the present disclosure.

In the above process according to this embodiment, the direct current bus is operated in the short-circuit state and the non-short-circuit state alternately by the inverter system, so that the output voltage of each photovoltaic module breaker alternately switches between a preset starting voltage and zero. After the direct current bus is operated in the short-circuit state and the non-short-circuit state alternately for the preset number of times, a small pulse is formed in the voltage of the direct current bus. After each photovoltaic module breaker detects the small pulse based on its own output voltage, the photovoltaic module breaker is turned on by itself, so that a photovoltaic module connected to the photovoltaic module breaker outputs electric energy. Therefore, the photovoltaic module breaker can determine whether the photovoltaic module breaker receives a turn-on signal only based on its own voltage acquisition device without additionally arranging any receiving devices, thereby reducing the hardware cost of the photovoltaic module breaker while the photovoltaic module breaker can communicate with an external apparatus. Accordingly, it is unnecessary to arrange a turn-on signal sending module in the inverter system, reducing hardware cost of the inverter system. Further, low-power voltage and current characteristics are utilized in the present disclosure, which is reliable and stable, thereby avoiding problems that power line carrier communication, wireless communication and the like are susceptible to interference, and improving stability of the photovoltaic rapid shutdown system.

Figure 1:
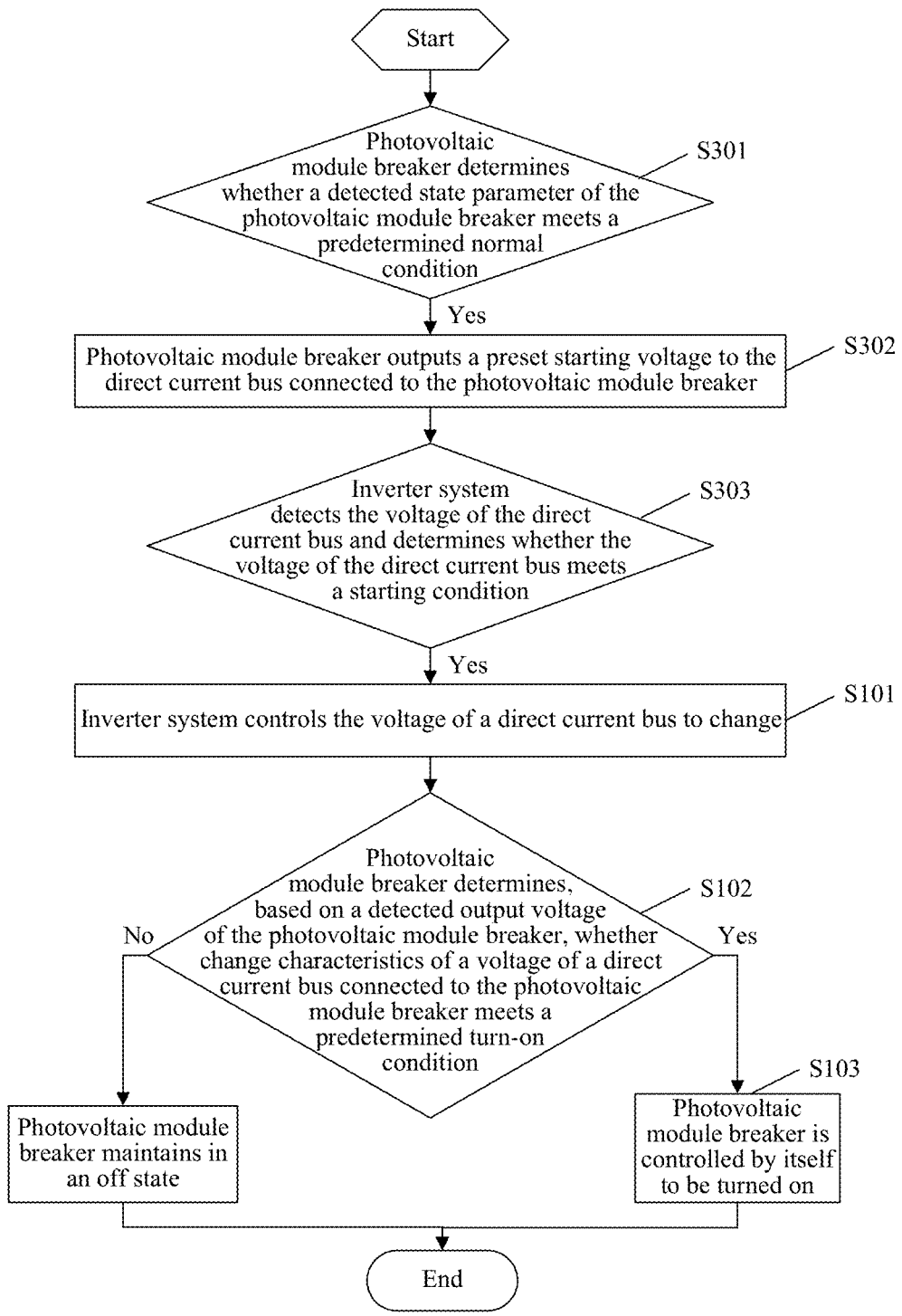
FIG. 1 is a schematic diagram showing a method for starting a photovoltaic rapid shutdown system according to an embodiment of the present disclosure.

In addition, as shown in FIG. 1, the method for starting a photovoltaic rapid shutdown system may further include the following steps S301 to S303 before step S101.

In step S301, the photovoltaic module breaker determines whether a detected state parameter of the photovoltaic module breaker meets a predetermined normal condition.

In a case that the state parameter meets the predetermined normal condition, step S302 is performed.

In step S302, the photovoltaic module breaker outputs a preset starting voltage to the direct current bus connected to the photovoltaic module breaker.

It should be noted that the state parameter includes at least one of an input current, an input voltage, and a temperature. Taking the input voltage as an example, in a case that the photovoltaic module breaker is in an off state, if a photovoltaic module connected to the photovoltaic module breaker generates a voltage, that is, the input voltage of the photovoltaic module breaker is not equal to zero, for example, at sunrise, the photovoltaic module breaker notifies the inverter system by outputting the preset starting voltage to the direct current bus connected to the photovoltaic module breaker, so that the inverter system determines that the photovoltaic module generates a voltage. However, at night or in a case that the photovoltaic module has a fault, the photovoltaic module breaker may not trigger the inverter system. That is, the photovoltaic module breaker may send no preset starting voltage to the inverter system. The fault of the photovoltaic module may include that the photovoltaic module is blocked and does not generate a voltage, the photovoltaic module is damaged and does not generate a voltage, and the like. The predetermined normal condition may indicate that a value of the state parameter of the photovoltaic module breaker is greater than a value of a preset state parameter. The value of the preset state parameter is not limited herein, and is determined according to actual conditions, which is within the protection scope of the present disclosure. The state parameter may further include other parameters, which are not described in detail herein and are determined according to actual conditions, and all of which are within the protection scope of the present disclosure.

In practice, a sum of starting voltages outputted by all photovoltaic module breakers connected to the direct current bus is less than a preset voltage. Therefore, the voltage of the direct current bus is maintained at a lower voltage before the inverter system controls each photovoltaic module to be turned on. The preset starting voltage is generally a direct current voltage of 1V. Alternatively, the preset starting voltage may also be a direct current voltage or alternating current voltage of other amplitudes. A value of the preset starting voltage is specified in the standard, such as 30V specified in NEC2017. The preset starting voltage may also have other values, which are not described in detail herein, and all of which are within the protection scope of the present disclosure.

Figure 4:
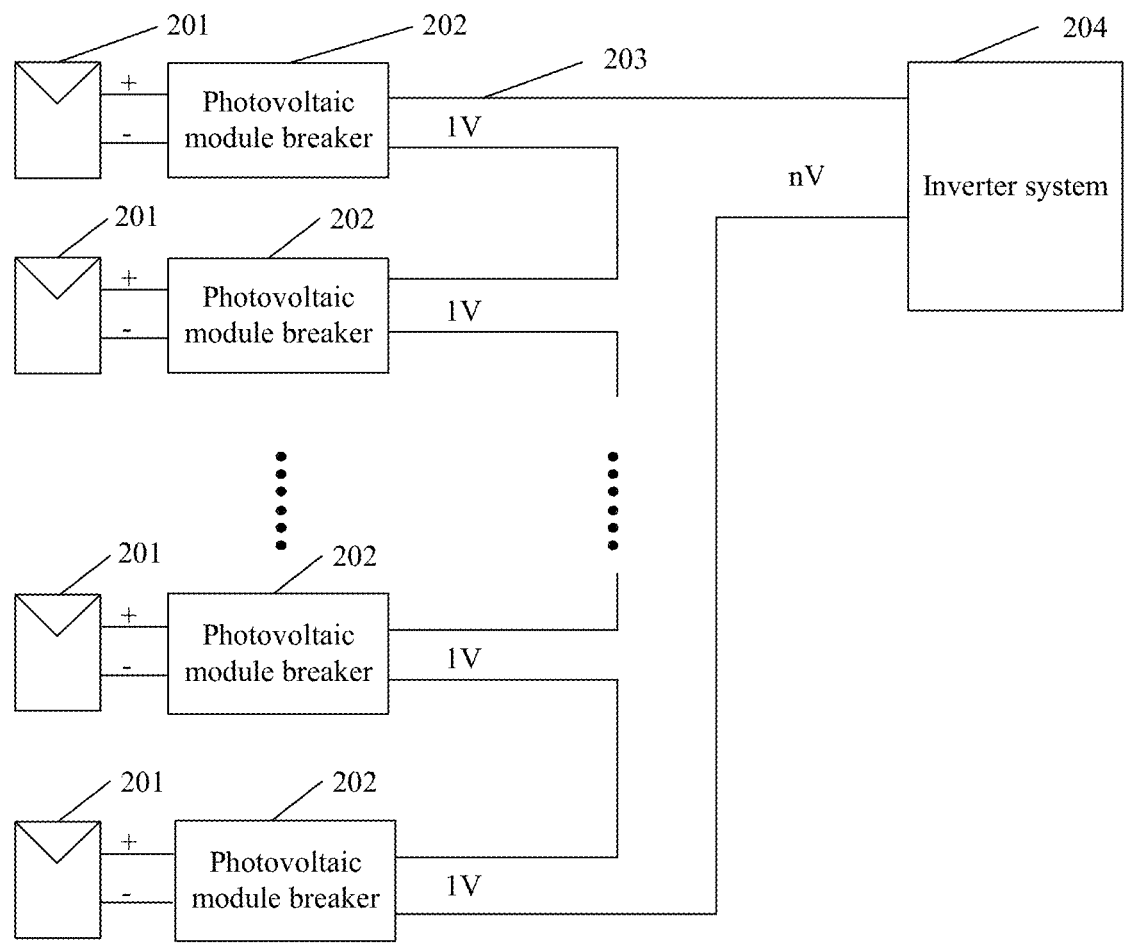
FIG. 4 is a schematic structural diagram of a photovoltaic rapid shutdown system according to an embodiment of the present disclosure, where a voltage of a direct current bus and output voltages of photovoltaic module breakers are shown.

FIG. 4 is a schematic structural diagram of a photovoltaic rapid shutdown system, where a voltage of a direct current bus and output voltages of photovoltaic module breakers are shown, to clearly describe a relationship between the starting voltage outputted by each photovoltaic module breaker and the voltage of the direct bus. When each photovoltaic module breaker is ready for use, that is, in a case that the state parameter of the photovoltaic module breaker meets the predetermined normal condition, the photovoltaic module breaker outputs a direct current voltage of 1V. The photovoltaic rapid shutdown system includes N photovoltaic module breakers. Each of the N photovoltaic module breakers corresponds to a photovoltaic module. When all the photovoltaic module breakers are ready for use, the photovoltaic module breakers each output a direct current voltage of 1V. Output voltages of the N photovoltaic module breakers are outputted in series to the direct current bus to generate a voltage Ub of nV, which is the voltage of the direct current bus.

In step S303, the inverter system detects the voltage of the direct current bus and determines whether the voltage of the direct current bus meets a starting condition.

The starting condition may indicate that the number of photovoltaic module breakers that output the starting voltages is greater than or equal to a preset number, where the number of photovoltaic module breakers that output the starting voltages is obtained from the voltage of the direct current bus. Alternatively, the starting condition may also be other condition indicating that the photovoltaic rapid shutdown system can be started, which is not described in detail herein and is within the protection scope of the present disclosure.

In practice, the inverter system first detects the voltage of the direct current bus, and then determines, based on the voltage of the direct current bus, the number of photovoltaic module breakers that output the starting voltages to the direct current bus. Then, the inverter system determines whether the number of photovoltaic module breakers that output the starting voltages is greater than or equal to the preset number. In a case that the number of photovoltaic module breakers that output the starting voltages is greater than or equal to the preset number, the inverter system determines that the voltage of the direct current bus meets the starting condition. In a case that the number of photovoltaic module breakers that output the starting voltages is not greater than or equal to the preset number, the inverter system determines that the voltage of the direct current bus does not meet the starting condition. A value of the preset number is not described in detail herein, which is determined according to actual conditions and is within the protection scope of the present disclosure.

In a distributed photovoltaic system, the number of photovoltaic modules connected in series to the direct current bus generally does not greater than 30. For example, the starting voltage is a constant direct current voltage Ux, and the voltage of the direct current bus detected by the inverter system is the voltage Ub. The inverter system calculates the number of photovoltaic module breakers that output the starting voltages to the direct current bus, that is, the number of photovoltaic module breakers that are ready for use, according to Nx=Ub/Ux. Then, the inverter system determines whether Nx is greater than or equal to the preset number. In a case that Nx is greater than or equal to the preset number, the inverter system determines that the voltage of the direct current bus meets the starting condition. Otherwise, the inverter system determines that the voltage of the direct current bus does not meet the starting condition.

In a case that the voltage of the direct current bus meets the starting condition, step S101 is performed. It should be noted that in a case that the voltage of the direct current bus is greater than a maximum value of a direct current state parameter allowed by the inverter system, the inverter system determines that the voltage of the direct current bus is abnormal and stops operating, that is, step S101 is not performed.

The photovoltaic module breaker sends no preset starting voltage at night or in the case that the photovoltaic module has a fault. Therefore, the inverter system does not perform starting operation frequently. That is, the inverter system does not frequently control the voltage of the direct current bus.

In this embodiment, in a case that electric energy outputted by the photovoltaic module is large, the photovoltaic module breaker notifies the inverter system by using the starting voltage. After determining that the voltage of the direct current bus meets the preset starting condition, the inverter system controls the voltage of the direct current bus. Therefore, a case that the inverter system continuously controls the voltage of the direct current bus even when the photovoltaic module breaker fails to respond can be prevented, thereby improving operation efficiency of the inverter system.

Figure 5:
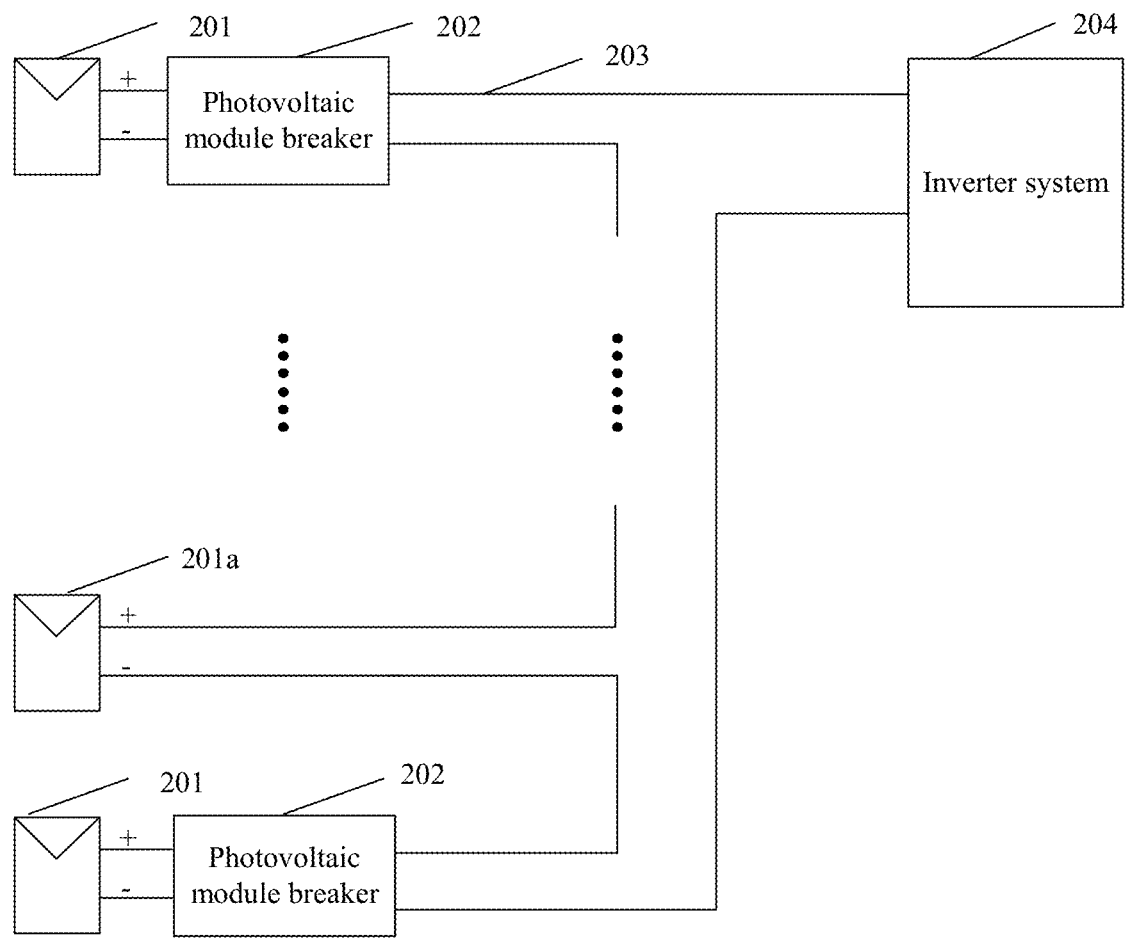
FIG. 5 is a schematic diagram showing an equivalent structure of a photovoltaic rapid shutdown system having a fault according to an embodiment of the present disclosure.

It should be noted that the photovoltaic rapid shutdown system may have a structure as shown in FIG. 5. There is at least one photovoltaic module (for example, a photovoltaic module 201a as shown in FIG. 5) that is not connected to a photovoltaic module breaker 202 in the photovoltaic rapid shutdown system. Alternatively, there is at least one photovoltaic module breaker 202 in the photovoltaic rapid shutdown system which has a fault and cannot be turned off by itself. In this case, an output voltage of the photovoltaic module (for example, the photovoltaic module 201a as shown in FIG. 5) is directly applied to a direct current bus 203, and is out of control of the photovoltaic rapid shutdown system. In this case, if other photovoltaic module breakers 202 are turned on, the voltage of the direct current bus 203 may exceed a limit value in the standard, resulting in an unsafe state of the system.

Figure 2:
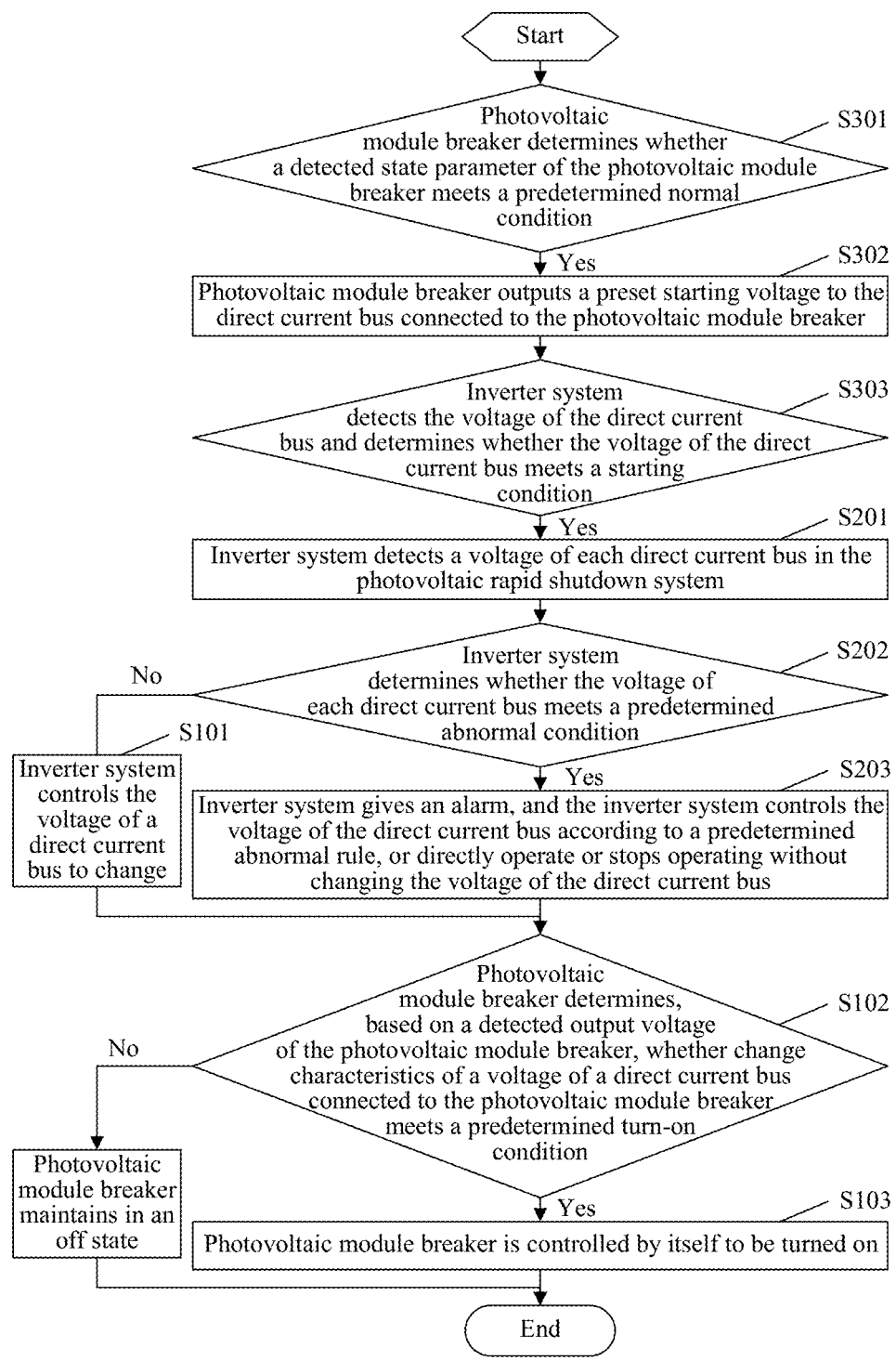
FIG. 2 is a schematic diagram showing a method for starting a photovoltaic rapid shutdown system according to another embodiment of the present disclosure.

Therefore, in practice, referring to FIG. 2 (which is shown as an example on the basis of FIG. 1), before the above step S101, the method for starting a photovoltaic rapid shutdown system further includes the following steps S201 to S203.

In step S201, the inverter system detects a voltage of each direct current bus in the photovoltaic rapid shutdown system.

In step S202, the inverter system determines whether the voltage of each direct current bus meets a predetermined abnormal condition.

The predetermined abnormal condition may indicate that the voltage of the direct current bus is greater than a preset voltage. The preset voltage may be a maximum voltage obtained in a case that all photovoltaic module breakers are in the off state. The preset voltage is not limited herein and can be determined according to actual conditions, which is within the protection scope of the present disclosure. The predetermined abnormal condition is not limited herein and can be determined according to actual conditions, which is within the protection scope of the present disclosure.

In a case that the voltage of at least one direct current bus meets the predetermined abnormal condition, step S203 is performed. In a case that the voltage of none of the direct current bus meets the predetermined abnormal condition, step S101 is performed.

In step S203, the inverter system provides an alarm, then the inverter system controls the voltage of the direct current bus according to a predetermined abnormal rule, or directly operate without changing the voltage of the direct current bus, or stops operating.

The alarm may be provided by limiting the output power, a fault indicator, reporting a fault code by communication, sending a warning message via a network platform, and the like, which are not described in detail herein and can be determined according to actual conditions, and which are within the protection scope of the present disclosure.

After providing the alarm, the inverter system determines whether to stop operating based on system settings. If the inverter system stops operating directly, operation safety can be ensured as much as possible. However, amount of power generation of the system may be reduced. Therefore, power generation may be continued after the alarm, including the following cases (1) and (2).

In case (1), the voltage of the direct current bus that meets the predetermined abnormal condition is controlled according to the predetermined abnormal rule. Specifically, in a case that the voltage of the direct current bus that meets the predetermined abnormal condition is less than a first preset voltage, a pulse width is limited to be within a preset range and the direct current bus is operated in the short-circuit state in the first time period, and the direct current bus is operated in the non-short-circuit state in the second time period.

The first preset voltage is a minimum starting voltage of the inverter system. It should be noted that in a case that the voltage of the direct current bus is less than the minimum starting voltage, the voltage of the direct current bus cannot meet a starting requirement of the photovoltaic rapid shutdown system. Therefore, a corresponding photovoltaic module breaker is required to be turned on, so that a photovoltaic module connected to the photovoltaic module breaker can output electric energy. Therefore, the voltage of the direct current bus can meet power demand of the photovoltaic rapid shutdown system. In order to avoid components of the inverter system from being damaged due to an over current caused by short-circuit, the inverter system is required to limit the pulse width during the short-circuit interval, so as to ensure safe use of the components of the inverter system. The preset range is not limited herein and can be determined according to actual conditions, which is within the protection scope of the present disclosure.

In case (2), the inverter system directly operates without changing the voltage of the direct current bus that meets the predetermined abnormal condition. Specifically, in a case that the voltage of the direct current bus that meets the predetermined abnormal condition is greater than a second preset voltage, the direct current bus is not short-circuited, so that the photovoltaic module breaker maintains in the off state.

The second preset voltage is greater than or equal to the first preset voltage. Therefore, the second preset voltage may be equal to the first preset voltage, that is, the minimum starting voltage of the inverter system. Alternatively, the first preset voltage may not be equal to the second preset voltage. The second preset voltage is not limited herein and can be determined according to actual conditions, which is within the protection scope of the present disclosure. A value of the second preset voltage is not limited herein, as long as output voltages of a photovoltaic module connected to a photovoltaic module breaker that cannot be turned off and a photovoltaic module without a photovoltaic module breaker meet a starting requirement of the inverter system in a case that the voltage of the direct current bus is greater than the second preset voltage. In this case, the inverter system may directly generate power.

Later, it may be determined depending on the system settings whether to stop power generation or turn on other photovoltaic module breakers, which can be determined according to actual conditions and is within the protection scope of the present disclosure.

It should be noted that, FIG. 2 shows only an example in which steps S201 and S202 are performed before step S101 and after steps S301, S302 and S303, these steps may be performed in other orders, which are not described in detail herein and determined according to actual conditions, and all are within the protection scope of the present disclosure.

In this embodiment, before controlling the voltage of each direct current bus, the inverter system determines whether the voltage of the direct current bus meets the predetermined abnormal condition. In a case that the voltage of the direct current bus meets the predetermined abnormal condition, the inverter system provides an alarm to avoid directly turning on the photovoltaic module breaker, so as to prevent the voltage of the direct current bus from exceeding the standard limit value, thereby improving safety of the photovoltaic rapid shutdown system.

Figure 6:
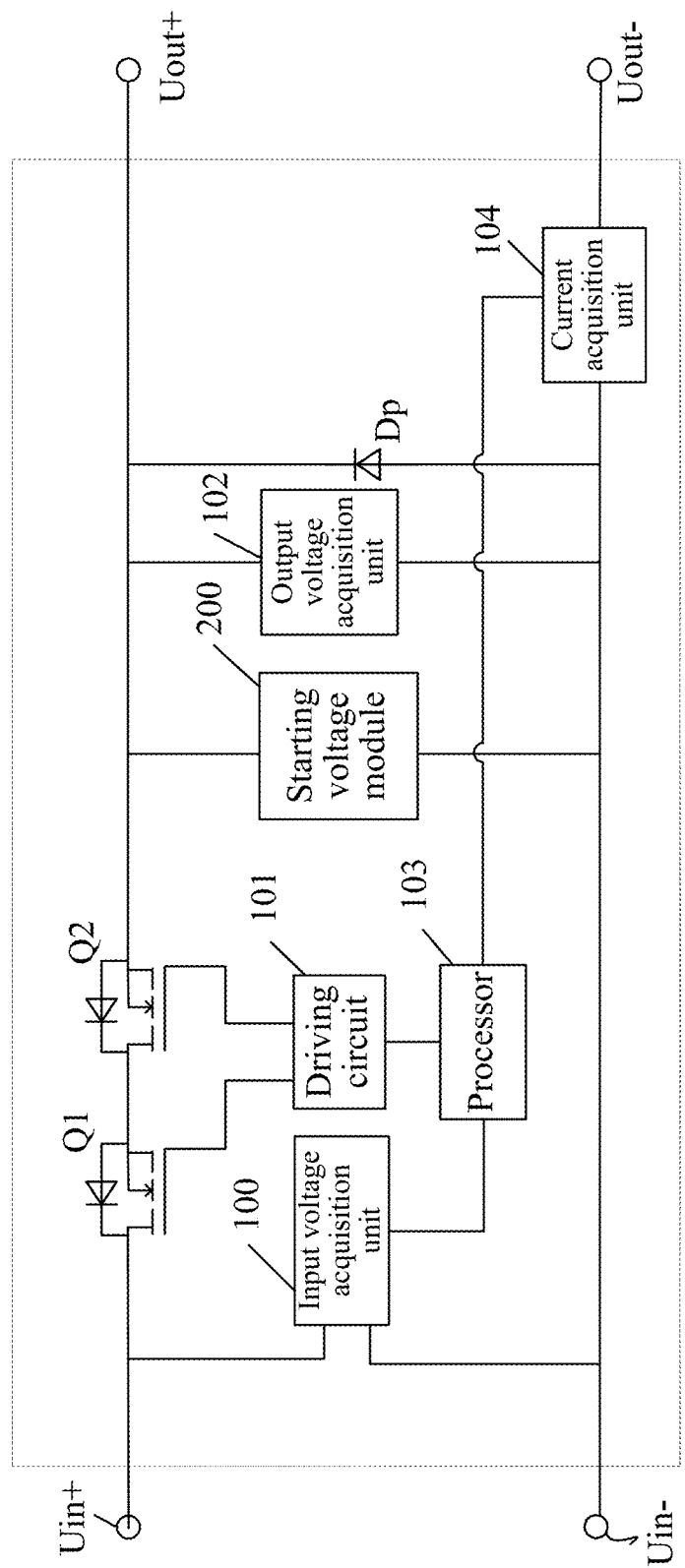
FIG. 6 is a schematic diagram showing a photovoltaic module breaker according to an embodiment of the present disclosure.

A photovoltaic module breaker is further provided according to an embodiment of the present disclosure. As shown in FIG. 6, the photovoltaic module breaker includes a switch unit (for example, switch modules Q1 and Q2 as shown in FIG. 6), a starting voltage module 200, a driving circuit 101, a processor 103, a bypass diode Dp and a parameter acquisition module (including an input voltage acquisition unit 100, an output voltage acquisition unit 102 and a current acquisition unit 104 as shown in FIG. 6).

The switch unit is arranged on a negative branch of the photovoltaic module breaker (which is not shown in the drawings). Alternatively, the switch unit is arranged on a positive branch of the photovoltaic module breaker (as shown in FIG. 6). An input end of the switch module Q1 serves as an input end of the switch unit, and is connected to a positive input end Uin+ of the photovoltaic module breaker. An output end of the switch module Q1 is connected to an input end of the switch module Q2. An output end of the switch module Q2 serves as an output end of the switch unit. The switch unit is configured to turn on or turn off the photovoltaic module breaker under control of the processor 103.

The switch unit includes at least one switch module (FIG. 6 shows an example in which the switch unit includes two switch modules). In a case that the number of switch modules is equal to one, an input end of the switch module serves as the input end of the switch unit, an output end of the switch module serves as the output end of the switch unit, and a control end of the switch module serves as a control end of the switch unit (not shown in the drawings). In a case that the number of switch modules is more than one, an input end of a branch formed by connecting the switch modules in series serves as an input end of the switch unit, an output end of the branch serves as an output end of the switch unit, and control ends of the switch modules serve as a control end of the switch unit. For example, as shown in FIG. 6, in a case that the number of switch modules is equal to two, the input end of the switch module Q1 serves as the input end of the switch unit, and is connected to a positive input end Uin+ of the photovoltaic module breaker, the output end of the switch module Q1 is connected to the input end of the switch module Q2, the output end of the switch module Q2 serves as the output end of the switch unit, and control ends of the switch modules Q1 and Q2 serve as the control end of the switch unit.

The switch module includes at least one transistor (FIG. 6 shows an example in which the switch module includes one transistor). In a case that the number of the transistor is more than one, the more than one transistor is connected in parallel and/or in series. The transistor serves as a semiconductor switching device, which may be a Metal-Oxide-Semiconductor Field-Effect Transistor (MOSFET) or an Insulated Gate Bipolar Transistor (IGBT). FIG. 6 shows an example in which the transistor is a MOSFET. An example in which the transistor is an IGBT is not described in detail herein, and is within the protection scope of the present disclosure.

The parameter acquisition module is configured to acquire a state parameter and an output voltage of photovoltaic module breaker and output the acquired state parameter and output voltage to the processor 103.

The parameter acquisition module includes an input voltage acquisition unit 100 and an output voltage acquisition unit 102. The input voltage acquisition unit 100 is arranged between a positive input end and a negative input end of the photovoltaic module breaker. A positive input end and a negative input end of the input voltage acquisition unit 100 are connected to the positive input end and the negative input end of the photovoltaic module breaker, respectively. An output end of the input voltage acquisition unit 100 is connected to the processor 103. The input voltage acquisition unit 100 is configured to acquire an input voltage of the photovoltaic module breaker, and output the acquired input voltage to the processor 103. The output voltage acquisition unit 102 is arranged between a positive output end and a negative output end of the photovoltaic module breaker. A positive output end and a negative output end of the output voltage acquisition unit 102 are connected to the positive output end and the negative output end of the photovoltaic module breaker, respectively. The output end of the output voltage acquisition unit 102 is connected to the processor 103. The output voltage acquisition unit 102 is configured to acquire an output voltage of the photovoltaic module breaker, and output the acquired output voltage to the processor 103.

In practice, the parameter acquisition module is further configured to acquire an output current of the photovoltaic module breaker. Accordingly, the parameter acquisition module further includes a current acquisition unit 104. In a case that the switch unit is turned on, the bypass diode Dp is turned off, and a current acquired by the current acquisition unit 104 is an output current of a photovoltaic module. In a case that the switch unit is turned off, a current acquired by the current acquisition unit 104 is a current flowing through the bypass diode Dp.

The current acquisition unit 104 usually has a small impedance, such that the current acquisition unit 104 may be arranged in various manners. Four arrangements (1) to (4) of the current acquisition unit 104 are described below.

In the arrangement (1), referring to FIG. 6, the current acquisition unit 104 is arranged on the negative branch of the photovoltaic module breaker and between an anode of the bypass diode Dp and a negative output end Uout− of the photovoltaic module breaker. Specifically, one end of the current acquisition unit 104 is connected to the negative output end Uout− of the photovoltaic module breaker, and the other end of the current acquisition unit 104 is connected to the anode of the bypass diode Dp and a negative input end Uin− of the photovoltaic module breaker.

Figure 7:
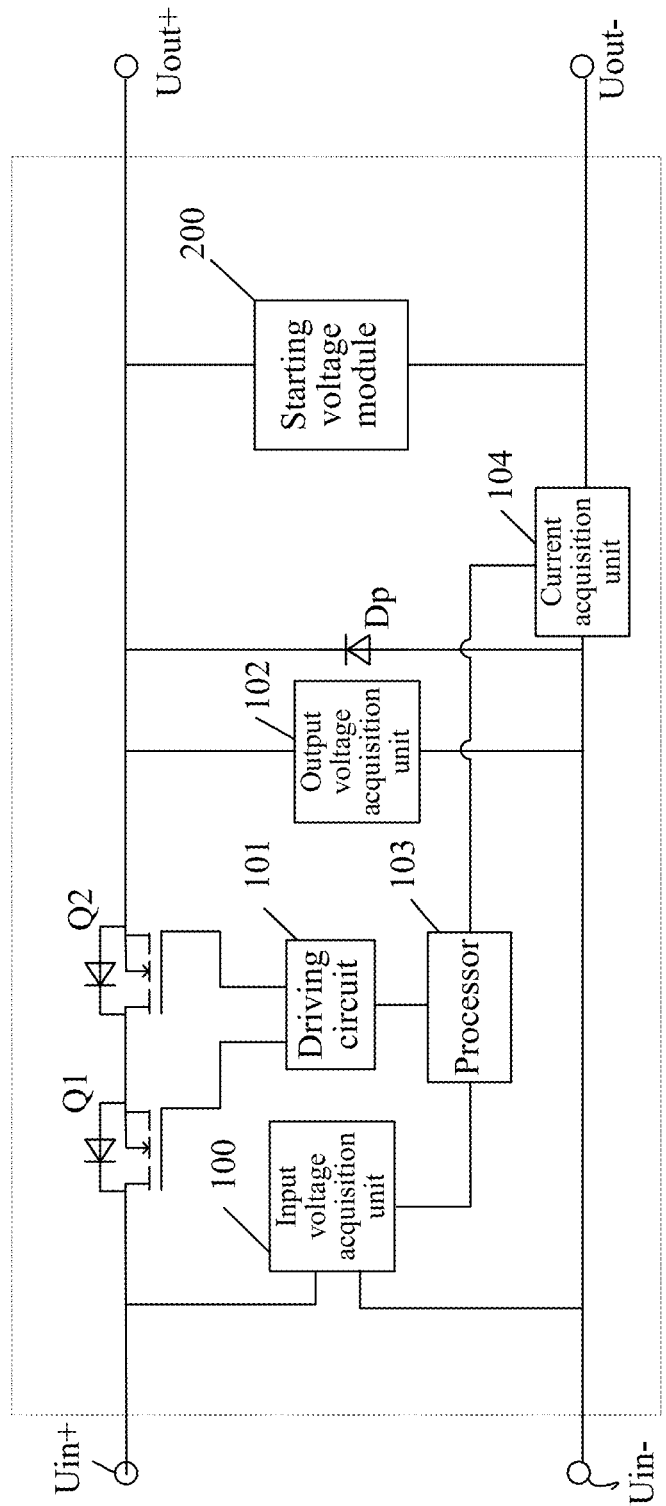
FIG. 7 is a schematic diagram showing a photovoltaic module breaker according to another embodiment of the present disclosure.

In the arrangement (2), referring to FIG. 7, the current acquisition unit 104 is arranged on the negative branch of the photovoltaic module breaker and between an anode of the bypass diode Dp and a negative output end of the starting voltage module 200. Specifically, one end of the current acquisition unit 104 is connected to the anode of the bypass diode Dp the negative input end Uin− of the photovoltaic module breaker, and the other end of the current acquisition unit 104 is connected to the negative output end of the starting voltage module 200 and the negative output end Uout− of the photovoltaic module breaker.

In the arrangement (3), the current acquisition unit 104 is arranged on the positive branch of the photovoltaic module breaker and between a cathode of the bypass diode Dp and a positive output end Uout+ of the photovoltaic module breaker. Specifically, one end of the current acquisition unit 104 is connected to the positive output end Uout+ of the photovoltaic module breaker, and the other end of the current acquisition unit 104 is connected to the cathode of the bypass diode Dp (which not shown in the drawings).

In the arrangement (4), the current acquisition unit 104 is arranged on the positive branch of the photovoltaic module breaker and between the cathode of the bypass diode Dp and a positive output end of the starting voltage module 200. Specifically, one end of the current acquisition unit 104 is connected to the positive output end Uout+ of the photovoltaic module breaker and the positive output end of the starting voltage module 200, and the other end of the current acquisition unit 104 is connected to the cathode of the bypass diode Dp (not shown in the drawings).

The positive output end and the negative output end of the starting voltage module 200 are connected to the positive output end and the negative output end of the photovoltaic module breaker, respectively. The starting voltage module 200 is configured to output, in a case that the photovoltaic module breaker is turned off and the state parameter meets a preset normal condition, a starting voltage to the output end of the photovoltaic module breaker under control of the processor 103. It should be noted that the starting voltage module 200 has an internal resistance, and an output of the starting voltage module 200 may be short-circuited, thus when the starting voltage module 200 is short-circuited, the output voltage of the starting voltage module 200 is zero.

Figure 8:
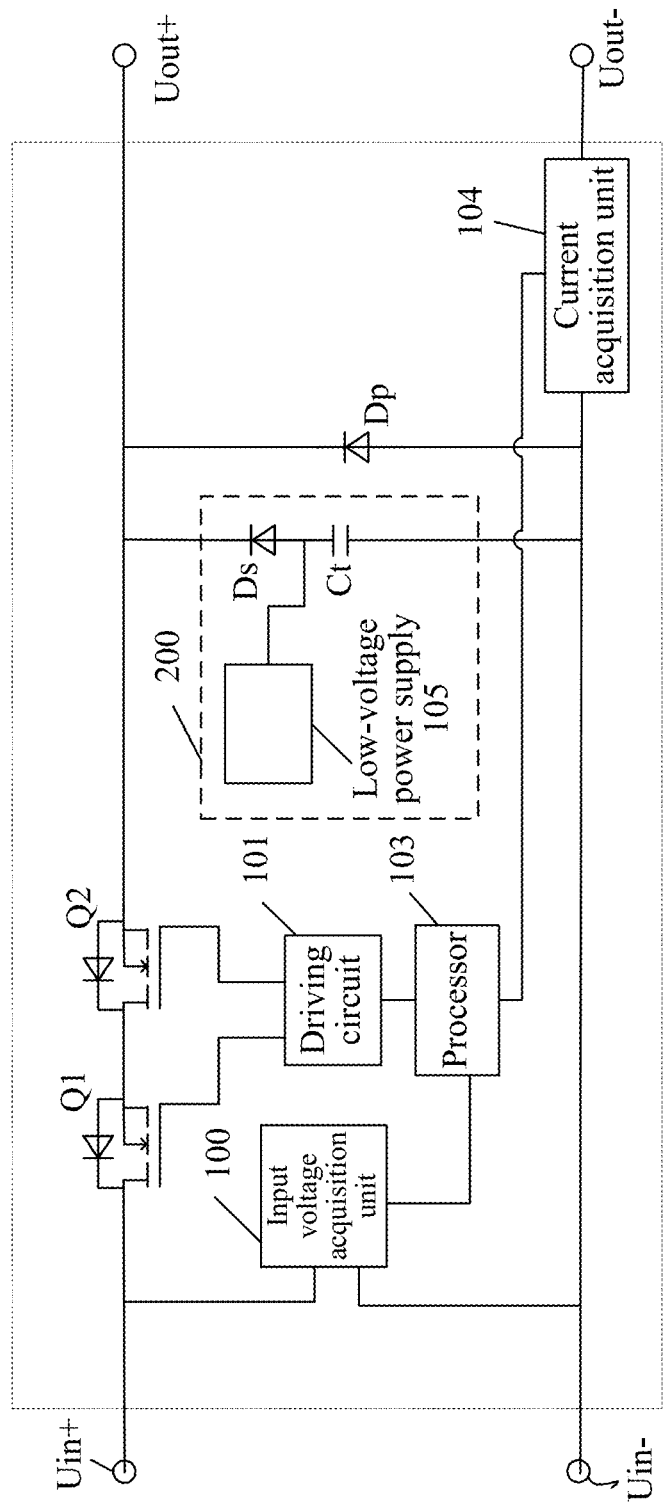
FIG. 8 is a schematic diagram showing a photovoltaic module breaker according to another embodiment of the present disclosure.
Figure 9:
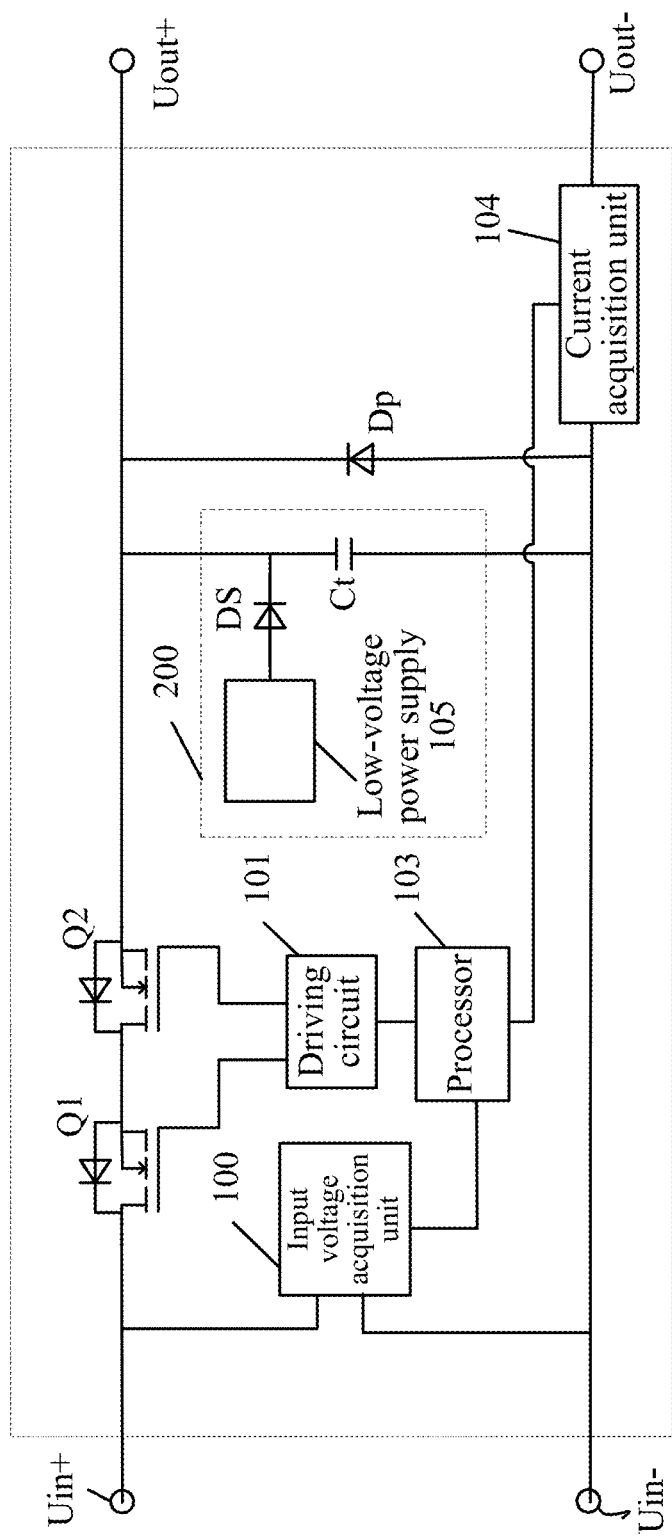
FIG. 9 is a schematic diagram showing a photovoltaic module breaker according to another embodiment of the present disclosure.

In practice, referring to FIGS. 8 and 9 (the output voltage acquisition unit 102 is not shown in FIGS. 8 and 9), the starting voltage module 200 includes a low-voltage power supply 105, a first capacitor Ct, and an anti-backflow diode Ds.

The low-voltage power supply 105 has an internal resistance and may be short-circuited. The low-voltage power supply 105 is configured to output, under control of the processor 103, the starting voltage via the anti-backflow diode Ds in a case that the photovoltaic module breaker is turned off and the state parameter meets a preset normal condition.

Referring to FIG. 8, a cathode of the anti-backflow diode Ds serves as the positive output end of the starting voltage module 200, an anode of the anti-backflow diode Ds is connected to an output end of the low-voltage power supply 105 and one end of the first capacitor Ct, and the other end of the first capacitor Ct serves as the negative output end of the starting voltage module 200. Alternatively, referring to FIG. 9, a cathode of the anti-backflow diode Ds is connected to one end of the first capacitor Ct with a connection point serving as a positive output end of the starting voltage module 200, an anode of the anti-backflow diode Ds is connected to an output end of the low-voltage power supply 105, and the other end of the first capacitor Ct serves as the negative output end of the starting voltage module 200.

An anode of the bypass diode Dp is connected to the negative output end Uout− of the photovoltaic module breaker. A cathode of the bypass diode Dp is connected to the positive output end Uout+ of the photovoltaic module breaker. The bypass diode Dp is configured to realize a bypass function of the photovoltaic module breaker in a case that the photovoltaic module breaker is turned off.

An output end of the processor 103 is connected to the control end of the switch unit via the driving circuit 101. The processor 103 is configured to control, in combination with the starting voltage module 200, the parameter acquisition module, the driving circuit 101, and the switch unit, the photovoltaic module breaker to perform the following steps in the method for starting a photovoltaic rapid shutdown system according to the above embodiment. These steps include: determining whether change characteristics of a voltage of a direct current bus connected to the photovoltaic module breaker meet a predetermined turn-on condition based on a detected output voltage of the photovoltaic module breaker; and turning on by itself in a case that the change characteristics of the voltage of the direct current bus connected to the photovoltaic module breaker meet the predetermined turn-on condition. In practice, the photovoltaic module breaker is further configured to: determine whether a detected state parameter of the photovoltaic module breaker meets a predetermined normal condition; and output a preset starting voltage to the direct current bus connected to the photovoltaic module breaker in the photovoltaic module shutdown system in a case that the state parameter meets the predetermined normal condition.

It should be noted that, for details for processing and operating principles of the photovoltaic module breaker corresponding to the steps in the method for starting the photovoltaic rapid shutdown system, reference may be made to the corresponding part in the method for starting the photovoltaic rapid shutdown system according to the above embodiment, which are not repeated here.

In this embodiment, the photovoltaic module breaker can be turned on and turned off by itself based on the state parameter and the output voltage acquired by its own parameter acquisition unit, without using a communication signal and without additionally arranging a signal receiving module for receiving a turn-on/turn-off communication signal outputted by the inverter system, thereby reducing the hardware cost of the photovoltaic module breaker.

Figure 10:
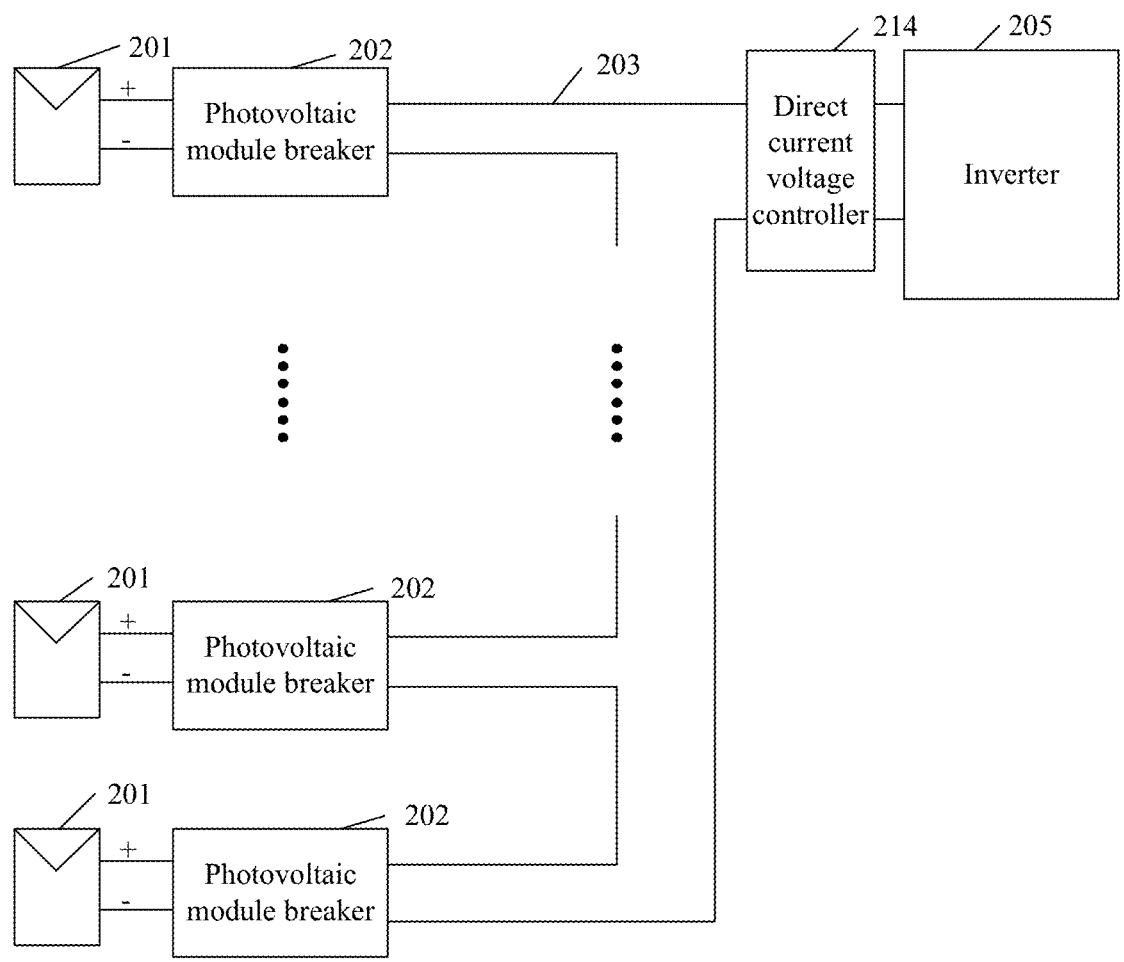
FIG. 10 is a schematic diagram showing an inverter system in a photovoltaic rapid shutdown system according to an embodiment of the present disclosure.

An inverter system is further provided according to an embodiment of the present disclosure. Referring to FIG. 10, the inverter system includes a direct current voltage control circuit and an inverter 205.

The direct current voltage control circuit is configured to control a voltage of a direct current bus in a photovoltaic rapid shutdown system.

The inverter 205 is configured to control, in combination with the direct current voltage control circuit, the inverter system to perform the following step in the method for starting a photovoltaic rapid shutdown system according to the above embodiment. The step include: controlling the voltage of the direct current bus. In practice, before controlling the voltage of the direct current bus, the inverter system is further configured to: detect the voltage of the direct current bus in the photovoltaic rapid shutdown system and determine whether the voltage of the direct current bus in the photovoltaic rapid shutdown system meets a starting condition. The step of controlling the voltage of the direct current bus is performed in a case that the voltage of the direct current bus meets the starting condition. The inverter system detects the voltage of each direct current bus in the photovoltaic rapid shutdown system.

In practice, before controlling the voltage of the direct current bus, the inverter system is further configured to: determine whether the voltage of each of direct current buses meets a predetermined abnormal condition. In a case that the voltage of at least one direct current bus meets the predetermined abnormal condition, the inverter system provides an alarm, and control the voltage of the direct current bus according to a predetermined abnormal rule, or directly operate without changing the voltage of the direct current bus, or stop operating. In a case that the voltage of none of the direct current bus meets the predetermined abnormal condition, the inverter system performs the step of controlling a voltage of a direct current bus in the photovoltaic rapid shutdown system.

It should be noted that, for details for processing and operating principles of the inverter system, reference may be made to the corresponding part in the method for starting the photovoltaic rapid shutdown system according to the above embodiment, which are not repeated here.

Figure 11:
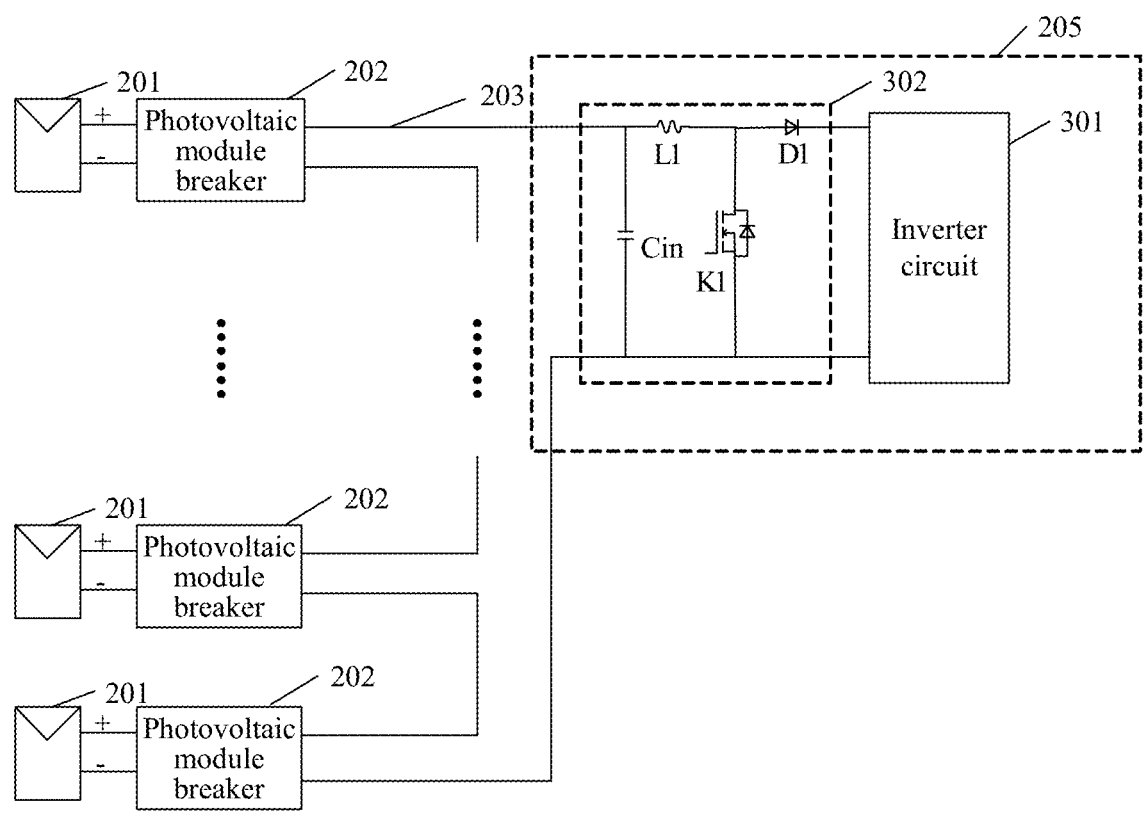
FIG. 11 is a schematic diagram showing an inverter system in the photovoltaic rapid shutdown system according to another embodiment of the present disclosure.

In practice, in an example, the direct current voltage control circuit may be implemented by a direct current voltage controller 214 independently arranged on the direct current bus (as shown in FIG. 10). In another example, the direct current voltage control circuit may be implemented by a direct current/direct current (DC/DC) circuit 302 arranged in the inverter 205 (as shown in FIG. 11). The above two examples are described in detail below.

In an example (1), referring to FIG. 10, the direct current voltage control circuit is implemented by the direct current voltage controller 214 independently arranged on the direct current bus. A positive output end of the direct current voltage controller 214 is connected to a positive electrode of the direct current bus, and a negative output end of the direct current voltage controller 214 is connected to a negative electrode of the direct current bus. The inverter 205 includes an inverter circuit. A direct current side of the inverter circuit serves as a direct current side of the inverter 205, and an alternating current side of the inverter circuit serves as an alternating current side of the inverter 205.

In an example (2), referring to FIG. 11, the direct current voltage control circuit is implemented by the direct current/direct current (DC/DC) circuit 302 arranged in the inverter 205. The inverter 205 further includes an inverter circuit 301. One end of the DC/DC circuit 302 serves as a direct current side of the inverter 205. The other end of the DC/DC circuit 302 is connected to a direct current side of the inverter circuit 301. An alternating current side of the inverter circuit 301 serves as an alternating current side of the inverter 205.

Figure 12:
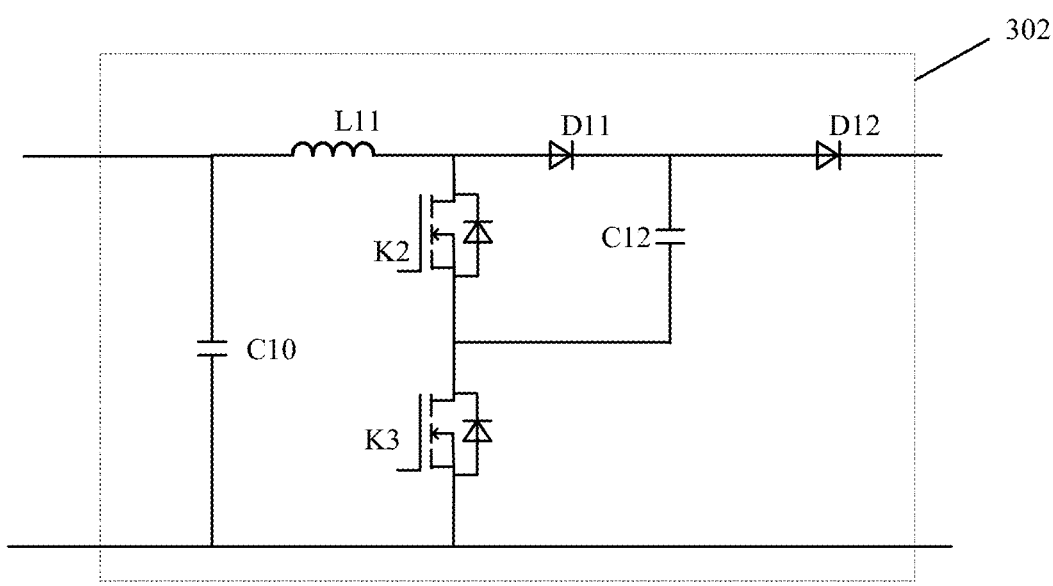
FIG. 12 is a schematic diagram showing an inverter system in the photovoltaic rapid shutdown system according to another embodiment of the present disclosure.

The DC/DC circuit 302 is a boost circuit, such as a basic boost circuit (as shown in FIG. 11) or a three-level boost circuit (as shown in FIG. 12). When transistors in the boost circuit are all turned on, the direct current bus 203 is short-circuited. When the transistors in the boost circuit are all turned off, the direct current bus 203 is out of the short-circuit state. After the process that the direct current bus is short-circuited and non-short-circuited is performed for a preset number of times, a small pulse is formed. After detecting the small pulse, the photovoltaic module breaker drives its switch unit to be turned on, so that a photovoltaic module connected to the photovoltaic module breaker outputs electrical energy.

It should be noted that, as shown in FIG. 11, the DC/DC circuit 302 is a basic boost circuit. Specifically, one end of an inductor L1 is connected to one end of an input capacitor Cin, where a connection point serves as a positive electrode of an end of the DC/DC circuit 302 as the direct current side of the inverter 205. The other end of the inductor L1 is connected to one end of a transistor K1 and one end of a diode D1. A cathode of the diode D1 is connected to a positive electrode of the direct current side of inverter circuit 301. The other end of the transistor K1 is connected to the other end of the input capacitor Cin, where a connection point serves as a negative electrode of the end of the DC/DC circuit 302 as the direct current side of the inverter 205, and is connected to a negative electrode of the direct current side of the inverter circuit 301. The direct current bus is short-circuited by turning on the transistor K1. The direct current bus is out of the short-circuit state by turning off the transistor K1.

Alternatively, as shown in FIG. 12 (which shows only a structure of the DC/DC circuit 302), the DC/DC circuit 302 is a flying capacitor type three-level boost circuit. Specifically, one end of an inductor L11 is connected to one end of an input capacitor C10, where a connection point serves as a positive electrode of an end of the DC/DC circuit 302 as the direct current side of the inverter 205. The other end of the inductor L11 is connected to one end of a transistor K2 and one end of a diode D11. A cathode of the diode D11 is connected to an anode of a diode D12 and one end of a flying capacitor C12. A cathode of the diode D12 is connected to the positive electrode of the direct current side of the inverter circuit 301. The other end of the transistor K2 is connected to one end of the transistor K3 and the other end of the flying capacitor C12. The other end of the transistor K3 is connected to the other end of the input capacitor Cin, where a connection point serves as a negative electrode of the end of the DC/DC circuit 302 as the direct current side of the inverter 205, and is connected to a negative electrode of the direct current side of the inverter circuit 301. The direct current bus is short-circuited by turning on the transistors K1 and K2. The direct current bus is out of the short-circuit state by turning off the transistors K1 and K2.

In this embodiment, the photovoltaic module breaker can be turned on or turned off via a direct current voltage control circuit without a starting signal transmission unit, thereby reducing hardware cost of the inverter system. In addition, in the conventional technology, a direct current combiner box with a larger volume or an additional direct current combiner box are required when arranging the starting signal transmission unit, that is, when adding an apparatus to the direct current bus, which increases construction cost. In this embodiment, it is unnecessary to add an apparatus to the direct current bus, thereby reducing construction cost.

It should be noted that in the conventional technology, automatic switches are arranged on the positive and negative electrodes of the direct current side of the inverter. The photovoltaic module breaker determines whether there is an input to the inverter by detecting an impedance of the direct current bus. A typical feature that there is an input to the inverter is that there is large capacitance on the direct current bus. However, with this solution in the conventional technology, automatic switches are required on the direct current side of the inverter, increasing cost of the inverter. In this embodiment, the inverter 205 including the DC/DC circuit 302 is used, it is unnecessary to additionally arrange control devices, such as the automatic switches, thereby reducing the cost of the inverter 205.

A photovoltaic rapid shutdown system is further provided according to an embodiment of the present disclosure. As shown in FIG. 13, the photovoltaic rapid shutdown system includes at least one shutdown system and at least one inverter system 204. The shutdown system includes a direct current bus 203, at least N photovoltaic modules 201 and at least N photovoltaic module breakers 202, where N is positive integer.

In the shutdown system, output ends of the photovoltaic module breakers 202 are cascaded. Input ends of the photovoltaic module breakers 202 are connected to output ends of respective photovoltaic modules 201, respectively. A positive electrode of a circuit formed by cascading the photovoltaic module breakers 202 is connected to a positive electrode of a corresponding direct current interface of the inverter system 204 via a positive electrode of the direct current bus 203. A negative electrode of the circuit formed by cascading the photovoltaic module breakers is connected to a negative electrode of a corresponding direct current interface of the inverter system 204 via a negative electrode of the direct current bus 203. It should be noted that a sign "+" represents a positive electrode, and a sign "−" represents a negative electrode.

Figure 14:
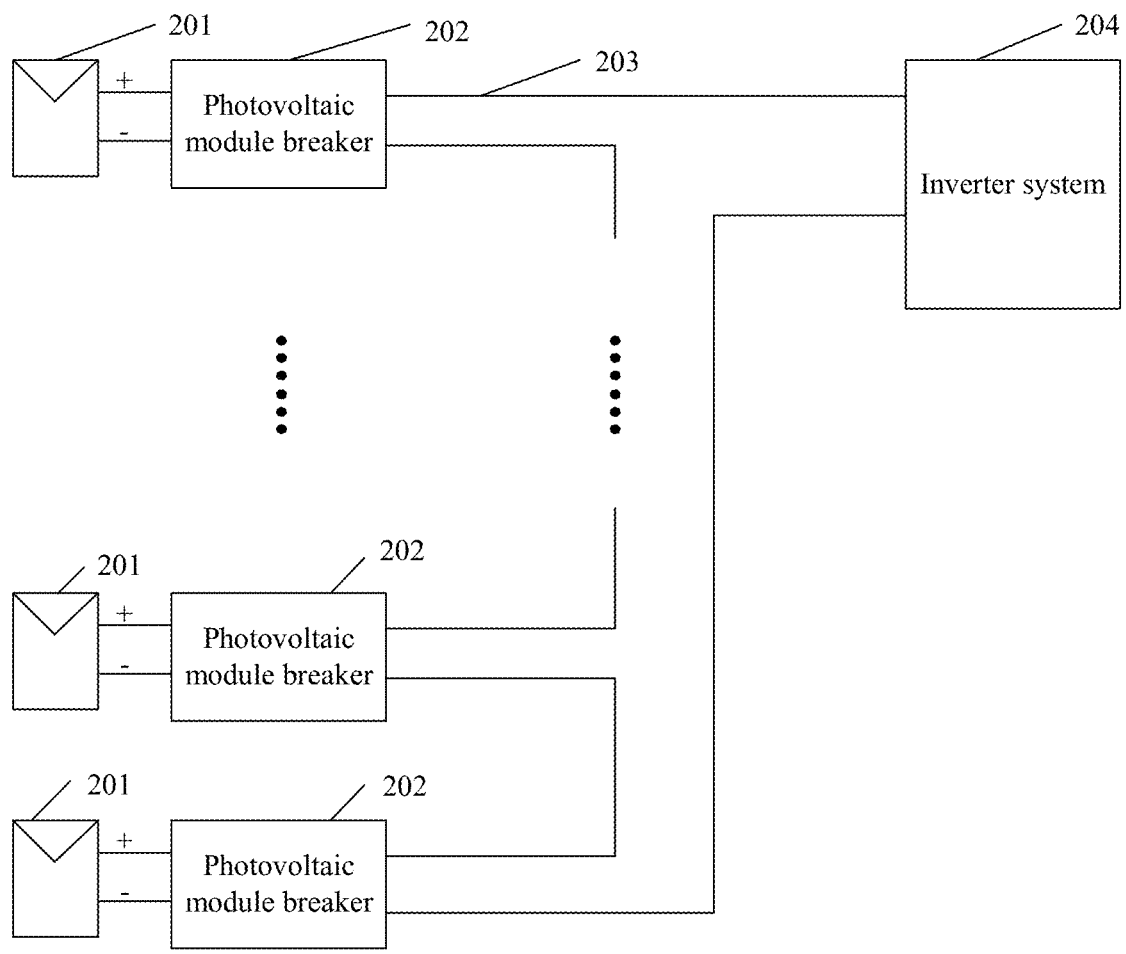
FIG. 14 is a schematic diagram showing a photovoltaic rapid shutdown system according to another embodiment of the present disclosure.
Figure 15:
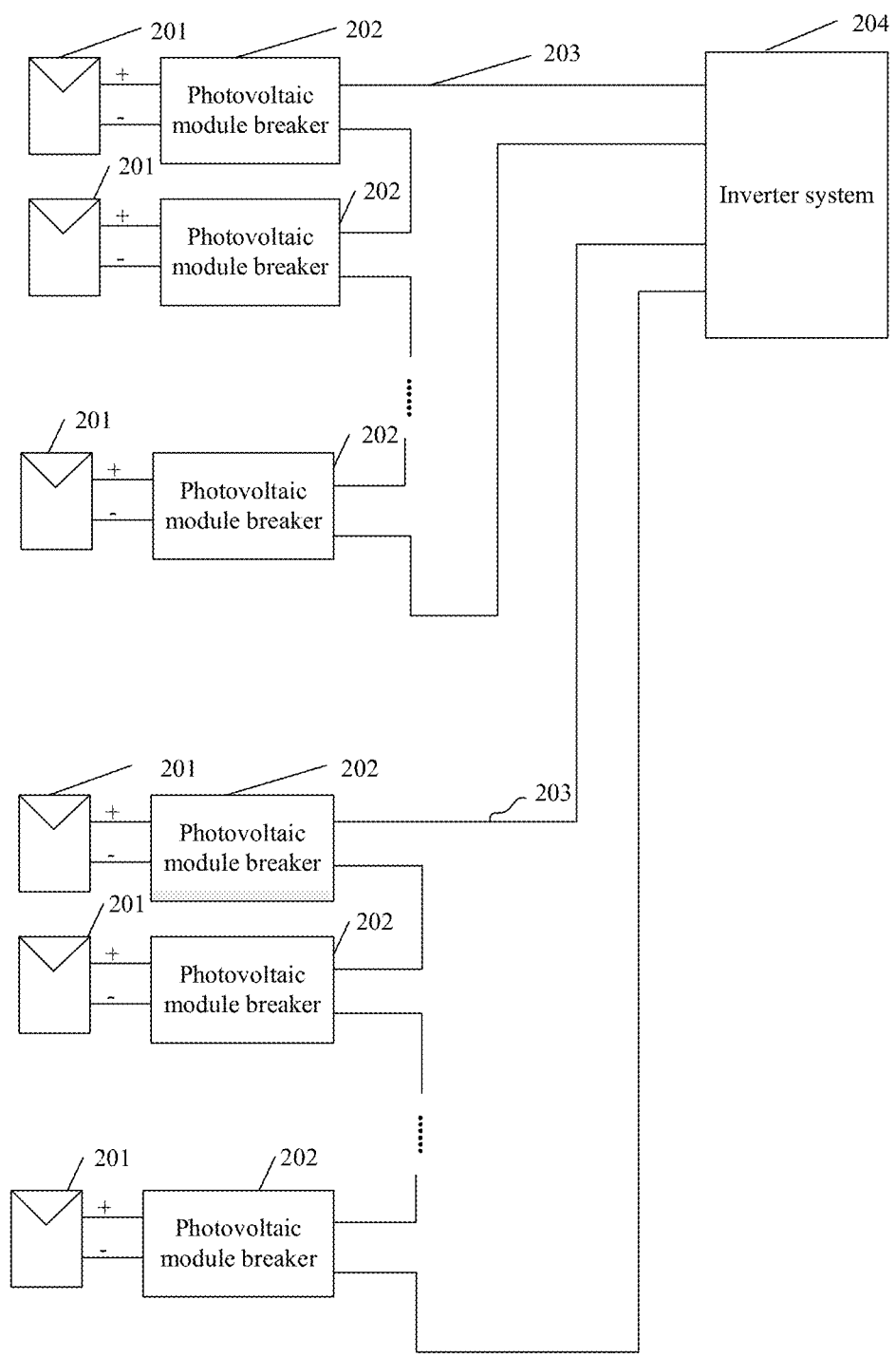
FIG. 15 is a schematic diagram showing a photovoltaic rapid shutdown system according to another embodiment of the present disclosure.

Each photovoltaic module breaker 202 may be connected to only one photovoltaic module 201 (as shown in FIG. 14). Alternatively, each photovoltaic module breaker 202 may be connected to multiple photovoltaic modules 201 (as shown in FIG. 13 which shows an example in which each photovoltaic module breaker 202 is connected to two photovoltaic modules 201). The photovoltaic rapid shutdown system may include one shutdown system (as shown in FIG. 14 and FIG. 13) or more shutdown systems (as shown in FIG. 15 which shows an example in which photovoltaic rapid shutdown system includes two shutdown systems). In one shutdown system, the photovoltaic module breaker 202 may be connected to the same number of photovoltaic modules 201 as each other photovoltaic module breakers 202, or different number of photovoltaic modules 201 from another photovoltaic module breaker 202, which is not limited herein and is determined according to actual conditions, and is within the protection scope of the present disclosure.

For a structure and operating principles of the inverter system 204, reference may be made to the inverter system 204 according to the above embodiment, which is not repeated here. For a structure and operating principles of the photovoltaic module breaker 202, reference may be made to the photovoltaic module breaker 202 according to the above embodiment, which is not repeated here.

In this embodiment, the photovoltaic module breaker 202 and the inverter system 204 jointly performing control to start the photovoltaic rapid shutdown system, providing a good applicability to industries that provide both a breaker and an inverter. In addition, hardware cost of the photovoltaic module breaker 202 and the inverter system 204 in the photovoltaic rapid shutdown system is low, such the hardware cost of the photovoltaic rapid shutdown system is also low.

Terms such as "first", "second" in the specification, claims and the above drawings of the present disclosure are used to distinguish similar and different objects, and are not necessarily used to describe a particular order or sequence. Features described in the embodiments in this specification can be replaced or combined with each other. The same or similar parts among the embodiments may be referred to each other, and each embodiment focuses on differences from other embodiments. Since the system or system embodiment is similar to the method embodiment, description thereof is relatively simple, and the relevant part can be referred to the part in the description of the method embodiment. The system and system embodiments described above are merely illustrative. Units described as separate components may or may not be physically separated, and components shown as units may or may not be physical units. That is, these components may be located in one place, or may be distributed to multiple network units. Some or all of the modules may be selected as needed to achieve the objects of the solutions of the present disclosure. Those skilled in the art can understand and implement the present disclosure without creative work.

Those skilled in the art may further realize that the units and algorithm steps in the examples described according to the embodiments of the present disclosure may be implemented by electronic hardware, computer software, or a combination of electronic hardware and computer software. In order to clearly illustrate interchangeability of hardware and software, components and steps in each example are generally described in accordance with functions in the above description. Whether these functions are implemented by hardware or software depends on specific applications and design constraint conditions of the technical solutions. Those skilled in the art may use different methods for each specific application to implement the described functions, but such implementation should not be considered beyond the scope of the present disclosure.

Based on the above description of the disclosed embodiments, those skilled in the art can implement or carry out the present disclosure. It is obvious for those skilled in the art to make many modifications to these embodiments. The general principle defined herein may be applied to other embodiments without departing from the spirit or scope of the present disclosure. Therefore, the present disclosure is not limited to the embodiments illustrated herein, but should be defined by the widest scope consistent with the principle and novel features disclosed herein.

The invention claimed is:

1. A method for starting a photovoltaic rapid shutdown system, comprising:
   controlling, by an inverter system in the photovoltaic rapid shutdown system, a voltage of a direct current bus in the photovoltaic rapid shutdown system;
   determining, by a photovoltaic module breaker in the photovoltaic rapid shutdown system based on a detected output voltage of the photovoltaic module breaker, whether change characteristics of the voltage of the direct current bus connected to the photovoltaic module breaker meets a predetermined turn-on condition; and
   turning on the photovoltaic module breaker via a switch unit in the photovoltaic module breaker in a case that the change characteristics of the voltage of the direct current bus connected to the photovoltaic module breaker meets the predetermined turn-on condition,
   wherein before the controlling, by an inverter system in the photovoltaic rapid shutdown system, a voltage of a direct current bus in the photovoltaic rapid shutdown system, the method for starting a photovoltaic rapid shutdown system further comprises:
   detecting, by the inverter system, a voltage of each of direct current buses in the photovoltaic rapid shutdown system; and
   determining, by the inverter system, whether the voltage of each of the direct current buses meets a predetermined abnormal condition, wherein
   in a case that the voltage of at least one of the direct current buses meets the predetermined abnormal condition, the inverter system generates an alarm; and the inverter system controls the voltage of the direct current bus according to a predetermined abnormal rule, or the inverter system directly operates without changing the voltage of the direct current bus; or the inverter system stops operating; and
   in a case that the voltage of none of the direct current buses meets the predetermined abnormal condition, the controlling, by an inverter system in the photovoltaic rapid shutdown system, a voltage of a direct current bus in the photovoltaic rapid shutdown system is performed,
   and wherein the inverter system controlling the voltage of the direct current bus according to the predetermined abnormal rule comprises:
   in a case that a voltage of a direct current bus that meets the predetermined abnormal condition is less than a first preset voltage, limiting a pulse width to be within a preset range and operating the direct current bus in the short-circuit state in the first time period, and operating the direct current bus out of the short-circuit state in the second time period.

2. The method for starting a photovoltaic rapid shutdown system according to claim 1, wherein the predetermined turn-on condition indicates that a pulse is formed in the voltage of the direct current bus.

3. The method for starting a photovoltaic rapid shutdown system according to claim 2, wherein the pulse is formed in the voltage of the direct current bus by operating the direct current bus into a short-circuit state and operating the direct current bus into a non-short-circuit state.

4. The method for starting a photovoltaic rapid shutdown system according to claim 1, wherein after the determining, by a photovoltaic module breaker in the photovoltaic rapid shutdown system based on a detected output voltage of the photovoltaic module breaker, whether change characteristics of the voltage of the direct current bus connected to the photovoltaic module breaker meets a predetermined turn-on condition, the method for starting a photovoltaic rapid shutdown system further comprises:
   maintaining the photovoltaic module breaker in an off state in a case that the change characteristics of the voltage of the direct current bus connected to the photovoltaic module breaker does not meet the predetermined turn-on condition.

5. The method for starting a photovoltaic rapid shutdown system according to claim 1, wherein before the controlling, by an inverter system in the photovoltaic rapid shutdown system, a voltage of a direct current bus in the photovoltaic rapid shutdown system, the method for starting a photovoltaic rapid shutdown system further comprises:
   determining, by the photovoltaic module breaker, whether a detected state parameter of the photovoltaic module breaker meets a predetermined normal condition, wherein the photovoltaic module breaker outputs a preset starting voltage to the direct current bus connected to the photovoltaic module breaker in a case that the state parameter meets the predetermined condition; and
   detecting the voltage of the direct current bus by the inverter system and determining, by the inverter system, whether the voltage of the direct current bus meets a starting condition, wherein the controlling, by an inverter system in the photovoltaic rapid shutdown system, a voltage of a direct current bus in the photovoltaic rapid shutdown system is performed in a case that the voltage of the direct current bus meets the starting condition.

6. The method for starting a photovoltaic rapid shutdown system according to claim 5, wherein detecting the voltage of the direct current bus by the inverter system and determining, by the inverter system, whether the voltage of the direct current bus meets a starting condition comprises:
- detecting the voltage of the direct current bus by the inverter system;
- determining, by the inverter system based on the voltage of the direct current bus, the number of the photovoltaic module breaker that outputs the preset starting voltage to the direct current bus; and
- determining, by the inverter system, whether the number of the photovoltaic module breaker that outputs the preset starting voltage is greater than or equal to a preset number, wherein
- it is determined that the voltage of the direct current bus meets the starting condition in a case that the number of the photovoltaic module breaker that outputs the preset starting voltage is greater than or equal to the preset number; and it is determined that the voltage of the direct current bus does not meet the starting condition in a case that the number of the photovoltaic module breaker that outputs the preset starting voltage is not greater than or equal to the preset number.

7. The method for starting a photovoltaic rapid shutdown system according to claim 1, wherein the controlling, by an inverter system in the photovoltaic rapid shutdown system, a voltage of a direct current bus in the photovoltaic rapid shutdown system comprises:
- controlling, by the inverter system according to a predetermined rule, the voltage of the direct current bus, to change the voltage of the direct current bus according to a predetermined change rule.

8. The method for starting a photovoltaic rapid shutdown system according to claim 7, wherein the controlling, by the inverter system according to a predetermined rule, the voltage of the direct current bus comprises: alternately operating the direct current bus in the short-circuit state during a first time period and operating the direct current bus in the non-short-circuit state during a second time period.

9. A photovoltaic rapid shutdown system comprising: a shutdown system; and an inverter system, wherein the shutdown system comprises a direct current bus, photovoltaic modules and photovoltaic module breakers, wherein
- in the shutdown system, output ends of the photovoltaic module breakers are cascaded, input ends of the photovoltaic module breakers are connected to output ends of respective photovoltaic modules, a positive electrode of a circuit formed by cascading the photovoltaic module breakers is connected to a positive electrode of a direct current interface of the inverter system via a positive electrode of the direct current bus, and a negative electrode of the circuit formed by cascading the photovoltaic module breakers is connected to a negative electrode of the direct current interface of the inverter system via a negative electrode of the direct current bus, and wherein
- the inverter system is configured to control a voltage of a direct current bus in the photovoltaic rapid shutdown system, and
- each of the photovoltaic module breakers is configured to: determine, based on a detected output voltage of the photovoltaic module breaker, whether change characteristics of the voltage of the direct current bus connected to the photovoltaic module breaker meet a predetermined turn-on condition; and be turned on via a switch unit in the photovoltaic module breaker in a case that the change characteristics of the voltage of the direct current bus connected to the photovoltaic module breaker meet the predetermined turn-on condition,
- wherein before the inverter system controlling a voltage of a direct current bus in the photovoltaic rapid shutdown system, the inverter system is further configured to:
- detect a voltage of each of direct current buses in the photovoltaic rapid shutdown system; and
- determine whether the voltage of each of the direct current buses meets a predetermined abnormal condition, wherein
- in a case that the voltage of at least one of the direct current buses meets the predetermined abnormal condition, the inverter system generates an alarm; and the inverter system controls the voltage of the direct current bus according to a predetermined abnormal rule, or the inverter system directly operates without changing the voltage of the direct current bus; or the inverter system stops operating; and
- in a case that the voltage of none of the direct current buses meets the predetermined abnormal condition, the inverter system controls the voltage of the direct current bus in the photovoltaic rapid shutdown system,
- and wherein the inverter system controlling the voltage of the direct current bus according to the predetermined abnormal rule comprises:
- in a case that a voltage of a direct current bus that meets the predetermined abnormal condition is less than a first preset voltage, limiting a pulse width to be within a preset range and operating the direct current bus in the short-circuit state in the first time period, and operating the direct current bus out of the short-circuit state in the second time period.

* * * * *